United States Patent
Blom

(10) Patent No.: US 9,473,074 B1
(45) Date of Patent: Oct. 18, 2016

(54) CHOPPER STABILIZED AMPLIFIER WITH SYNCHRONOUS SWITCHED CAPACITOR NOISE FILTERING

(71) Applicant: IXYS Corporation, Milpitas, CA (US)

(72) Inventor: Eric Blom, Wakefield, MA (US)

(73) Assignee: IXYS Corporation, Milpitas, CA (US)

( * ) Notice: Subject to any disclaimer, the term of this patent is extended or adjusted under 35 U.S.C. 154(b) by 0 days.

(21) Appl. No.: 14/852,921

(22) Filed: Sep. 14, 2015

(51) Int. Cl.
*H03F 1/02* (2006.01)
*H03F 1/26* (2006.01)
*H03F 3/393* (2006.01)

(52) U.S. Cl.
CPC ............... *H03F 1/26* (2013.01); *H03F 3/393* (2013.01); *H03F 2200/171* (2013.01)

(58) Field of Classification Search
CPC .......................................................... H03F 1/02
USPC ...................................... 330/9; 327/124, 307
See application file for complete search history.

(56) References Cited

U.S. PATENT DOCUMENTS

| | | | | |
|---|---|---|---|---|
| 7,292,095 | B2* | 11/2007 | Burt | H03F 1/26 330/69 |
| 2014/0139285 | A1* | 5/2014 | Maderbacher | H03F 3/387 330/9 |
| 2014/0210547 | A1* | 7/2014 | Tomioka | H03F 3/387 330/9 |
| 2015/0207477 | A1* | 7/2015 | Stanescu | H03F 3/45475 330/9 |
| 2015/0288336 | A1* | 10/2015 | Kusuda | H03F 3/387 330/9 |
| 2015/0357979 | A1* | 12/2015 | Ouchi | H03F 3/45192 330/9 |

* cited by examiner

*Primary Examiner* — Henry Choe
(74) *Attorney, Agent, or Firm* — Imperium Patent Works; Daniel Tagliaferri; Amir V. Adibi

(57) ABSTRACT

A chopper stabilized amplifier with synchronous switched capacitor noise filtering is disclosed. In an exemplary embodiment, an apparatus includes a chopper amplifier having an input that receives an input signal and an output that outputs an amplified signal. The chopper amplifier includes an input chopping circuit and an output chopping circuit, where the input and output chopping circuits operate in response to a chop clock. The apparatus also includes a switched capacitor filter having an input that receives the amplified signal and an output that outputs a filtered signal. The switched capacitor filter operates in response to a filter clock. The apparatus also includes a filter timing adjuster that receives a reference voltage and adjusts a phase of the filter clock with respect to the chop clock to reduce chopper noise on that reference voltage.

20 Claims, 14 Drawing Sheets

CHOPPER STABILIZED AMPLIFIER WITH SYNCHRONOUS SWITCHED CAPACITOR NOISE FILTERING

TECHNICAL FIELD

The present disclosure relates generally to chopper stabilized voltage amplifiers and more particularly to chopper stabilized amplifiers with synchronous filtering.

BACKGROUND INFORMATION

Solid state reference voltage generators include an amplifier that is used to generate a Direct Current (DC) reference voltage. During operation, chopping an input stage of the amplifier can cause an offset of the amplifier to appear as a square or triangle wave signal at the chopping frequency at the amplifier output. In addition, voltage spikes at the chopper clock edges can propagate through to the output due to amplifier internal feedthrough and through the feedback network from the input to the output. When the amplifier is being used to produce a reference DC voltage, the square wave signal and voltage spike noise are undesirable. A more robust solution is desired.

SUMMARY

A chopper stabilized amplifier with synchronous switched capacitor noise filtering is disclosed. In an exemplary embodiment, the novel amplifier reduces noise at the chopper frequency at the voltage output of the amplifier. A servo loop is included to continuously monitor the voltage output for noise at the chopper frequency. The servo loop continuously adjusts the delay of the capture time of a switched capacitor filter to optimally reduce the output noise at the chopper frequency. The amplifier also employs an ultra-wideband voltage follower stage at the amplifier output to absorb voltage spike noise at the output.

The foregoing is a summary and thus contains, by necessity, simplifications, generalizations and omissions of detail; consequently is it appreciated that the summary is illustrative only. Still other methods, and structures and details are set forth in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Figure 1:
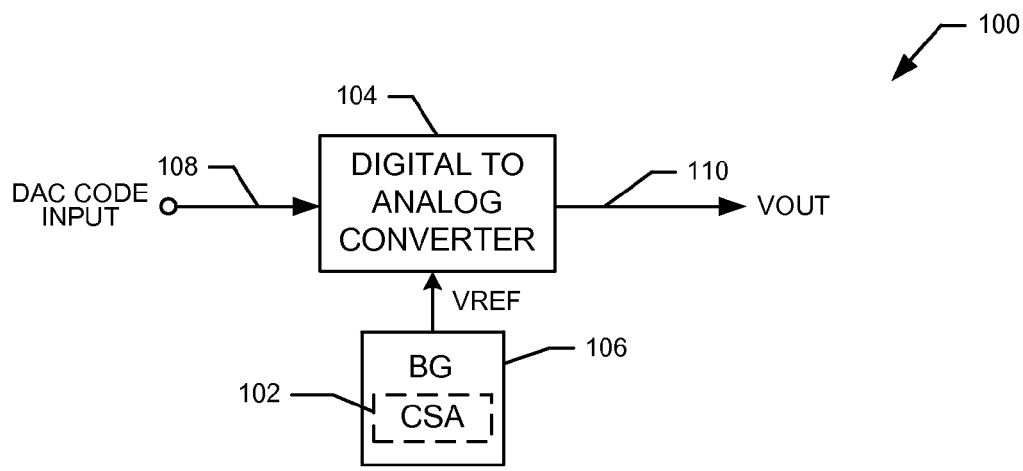
FIG. 1 is a diagram of a digital to analog converter that includes an exemplary embodiment of a chopper stabilized amplifier with synchronous switched capacitor noise filtering.

FIG. 1 is a diagram of a digital to analog converter (DAC) system 100 that includes an exemplary embodiment of a chopper stabilized amplifier with synchronous switched capacitor noise filtering 102. The system 100 includes DAC 104 and bandgap voltage generator (BG) 106. During operation, the BG 106 generates a reference voltage signal (VREF) that is input to the DAC 104. The DAC 104 uses the VREF signal to convert a digital code 108 to a corresponding output voltage 110.

In an exemplary embodiment, the BG 106 includes the chopper stabilized amplifier with synchronous switched capacitor noise filtering 102. For clarity, the chopper stabilized amplifier with synchronous switched capacitor noise filtering 102 is also referred to herein as "CSA" 102. In an exemplary embodiment, the CSA 102 generates the VREF signal having less chopper noise when compared to conventional chopper amplifiers. This reduced noise level results in improved performance of the system 100. More detailed descriptions of the design and operation of the CSA 102 are provided below.

Figure 2:
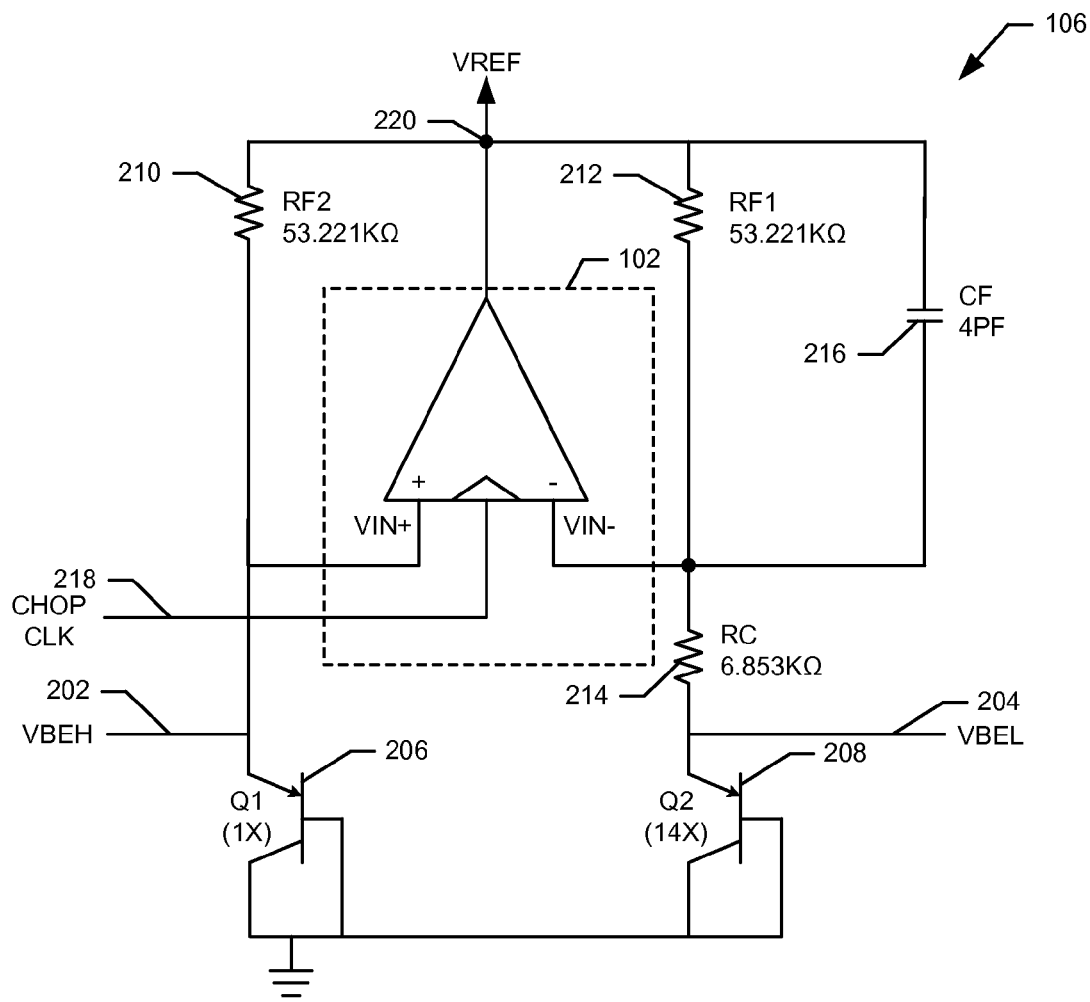
FIG. 2 is an exemplary detailed embodiment of a bandgap voltage generator shown in FIG. 1 that includes the chopper stabilized amplifier with synchronous switched capacitor noise filtering.

FIG. 2 is an exemplary detailed embodiment of the bandgap voltage generator 106 shown in FIG. 1. As shown in FIG. 2, the BG 106 includes the CSA 102.

The BG 106 includes transistors 206, 208, resistors 210, 212, and 214, and capacitor 216. In the exemplary embodiment shown in FIG. 2, the transistor 208 comprises 14 parallel transistors, each matched to transistor 206.

The BG 106 generates a signal VBEH 202 at an emitter terminal of the transistor 206, and also generates a signal VBEL 204 at an emitter terminal of the transistor 208. The transistors 206 and 208 have base and collector terminals connected to a signal ground. The emitter terminal of the transistor 206 is also connected to a first terminal of the resistor 210. A second terminal of the resistor 210 is connected to an output terminal 220. The emitter terminal of the transistor 208 is also connected to a first terminal of the resistor 214 and a second terminal of the resistor 214 is connected to a first terminal of the resistor 212 and a first terminal of the capacitor 216. Second terminals of the resistor 212 and capacitor 216 are connected to the output terminal 220.

The voltage VBEH 202 is applied to the positive input of CSA 102 as a VIN+ input. Because RF1=RF2 and because the voltage between the + and − inputs to CSA 102 is very small, the VREF signal that appears at node 220 will cause identical voltages across RF1 and RF2 and thus identical currents to flow through RF1 and RF2. Because the current density is 14 times lower at Q2 than at Q1, VBEL will be a lower voltage than VBEH and the voltage difference DVBE=(VBEH−VBEL)=(kT/q)(ln(14)) will be dropped across resistor RC 214. Here k is Boltzmann's constant, q is the charge of an electron, T is temperature in degrees Kelvin and the factor of 14 is the ratio of the current densities at Q1 to Q2. DVBE increases as temperature increases. VBEH decreases as temperature increases, approximately given by VBEH=VGO−(kT/q)ln(I0/IQ1) where VGO is the bandgap voltage for silicon, I0 is a processing constant describing Q1 and IQ1 is the current flowing through the emitter of Q1. When the ratio RF1/RC is chosen to generate the VREF signal at node 220, the voltage increase with temperature at node 220 due to DVBE nearly exactly cancels the voltage decrease due to VBEH 202 and the circuit implements a bandgap dc voltage reference.

The CSA 102 also receives a chop clock (FCHOP) 218 that is used to drive internal chopping circuits. The CSA 102 also includes switched capacitor filtering and other synchronization circuitry not shown in FIG. 2 but shown in greater detail in FIG. 3. During operation, the CSA 102 operates to generate the VREF signal at node 220 exhibiting less chopper noise than conventional chopper stabilized amplifiers.

Figure 3:
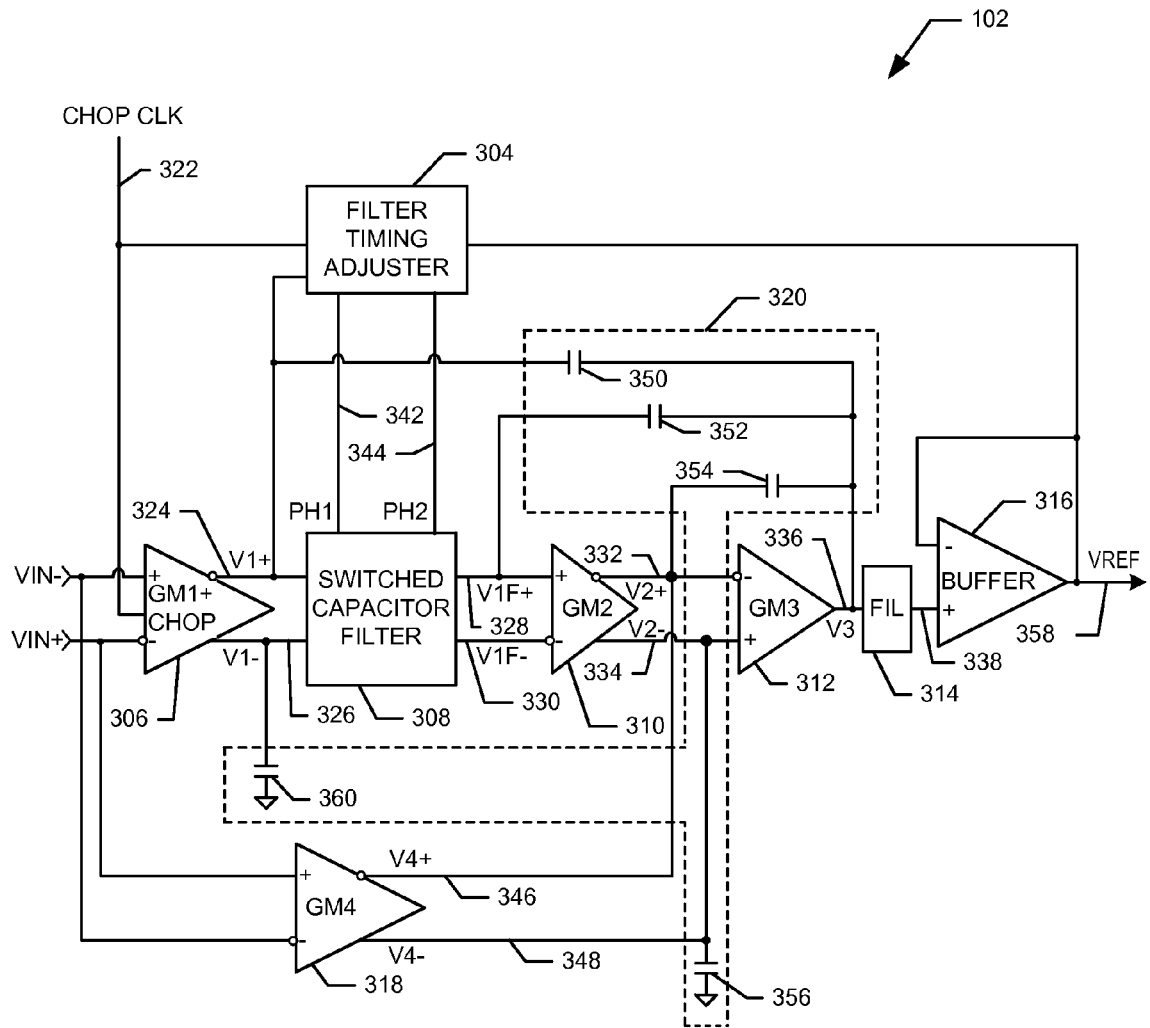
FIG. 3 is an exemplary detailed embodiment of the chopper stabilized amplifier with synchronous switched capacitor noise filtering shown in FIG. 2.

FIG. 3 is an exemplary detailed embodiment of the chopper stabilized amplifier with synchronous switched capacitor noise filtering 102 shown in FIG. 1 and FIG. 2. The CSA 102 comprises filter timing adjuster 304, GM1 amplifier plus chop circuit 306, switched capacitor filter 308, GM2 amplifier 310, GM3 amplifier 312, GM4 amplifier 318, filter stage 314, buffer 316, and modified nested miller compensation circuit 320.

In an exemplary embodiment, a chop clock 322 is input to the GM1 amplifier plus chop circuit 306 and the filter timing adjuster 304. In an exemplary embodiment, the chop clock 322 is a square wave having a frequency of approximately 400 KHz. The GM1 amplifier plus chop circuit 306 receives input voltages (VIN+, VIN−) and generates output voltages (V1+) 324 and (V1−) 326 that are input to the switched capacitor filter 308. In an exemplary embodiment, the amplified signals V1+ 324 and V1− 326 may include an amount of noise (e.g., chopper noise) as a result of the operation of the GM1 amplifier plus chop circuit 306.

The filter 308 filters the input signals it receives to generate filtered output signals (V1F+) 328 and (V1F−) 330. The filter 308 performs a filtering function utilizing filter clocks (PH1) 342 and (PH2) 344 received from the filter timing adjuster 304. Due to variation of semiconductor processing steps, component mismatch and/or change in operating conditions, the delay from the chop clock to the chopper-caused noise at V1+, V1− will vary. In an exemplary embodiment, the filter timing adjuster 304 operates to adjust the delay of the PH1 342 and PH2 344 clock signals to reduce the amount of chopper noise that appears at the output of the switched capacitor filter 308.

The outputs (328, 330) of the switch capacitor filter 308 are input to the GM2 amplifier 310 to generate outputs (V2+) 332 and (V2−) 334. The outputs V2+ 332 and V2− 334 from the GM2 amplifier 310 are input to the GM3 amplifier 312. The input voltages (VIN+, VIN−) are also input to the GM4 amplifier 318 to generate outputs V4+ 346 and V4− 348 that are also input to the GM3 amplifier 312. The GM3 amplifier 312 amplifies the signals at its inputs to generate output V3 336. The amplifier GM4 provides a feed-forward path for the input signals that controls the output during transients. Amplifiers GM4 and GM2 are designed with very low open-loop gain. Amplifier GM1 is designed for very high open-loop gain. The amount of chopper noise suppression is proportional to the difference in the open-loop gains of these amplifiers, e.g., [noise suppression=(Aol GM1)−(Aol GM4)]. Amplifier GM3 combines the filtered and fed-forward signals and may be of only moderate open-loop gain because of the gain (Aol GM4) in front of it.

The output V3 336 is input to a modified nested miller compensation circuit 320 that comprises capacitors 350, 352, 354, 356, and 360. At a compensation input, a first terminal of the capacitor 354 is connected to the output V3 336 and at a first compensation output, a second terminal of the capacitor 354 is connected to the inverting input terminal of the GM3 amplifier 312. At the compensation input, a first terminal of the capacitor 352 is connected to the output V3 336 and at a second compensation output, a second terminal of the capacitor 352 is connected to the non-inverting input terminal of the GM2 amplifier 310. At the compensation input, a first terminal of the capacitor 350 is connected to the output V3 336, and at a third compensation output, a second terminal of the capacitor 350 is connected to the output V1+ 324 of the GM1 amplifier plus chopper circuit 306. A first terminal of the capacitor 356 is connected to the non inverting input terminal of the GM2 amplifier 312 and a second terminal of the capacitor 356 is connected to a signal ground. The capacitor 360 is connected between the non-inverting output of the GM1 amplifier 306 and the signal ground.

The output V3 336 of the GM3 amplifier 312 is input to the filter 314 to generate filtered output 338. In an exemplary embodiment, the filter 314 is a simple RC filter. In other embodiments, the filter 314 is a more complex filter. The filtered output 338 is input to a non-inverting input terminal of the buffer amplifier 316 and buffered to generate the VREF signal 358. In an exemplary embodiment, the buffer amplifier 316 comprises a super wideband amplifier that absorbs noise glitches that may occur at the edges of the chop clock.

The filter timing adjuster 304 receives the VREF signal 358, the chop clock 322, and the V1+ output 324 of the GM1 amplifier plus chopper circuit 306. The filter timing adjuster 304 utilizes the signals it receives to generate the filter clocks PH1 342 and PH2 344.

During operation the filter timing adjuster 304 adjusts the phases of the filter clocks PH1 342 and PH2 344 with respect to the chop clock 322 to reduce or eliminate the amount of chopper noise that appears at the output of the filter 314, and correspondingly, on the VREF signal 358.

Figure 4:
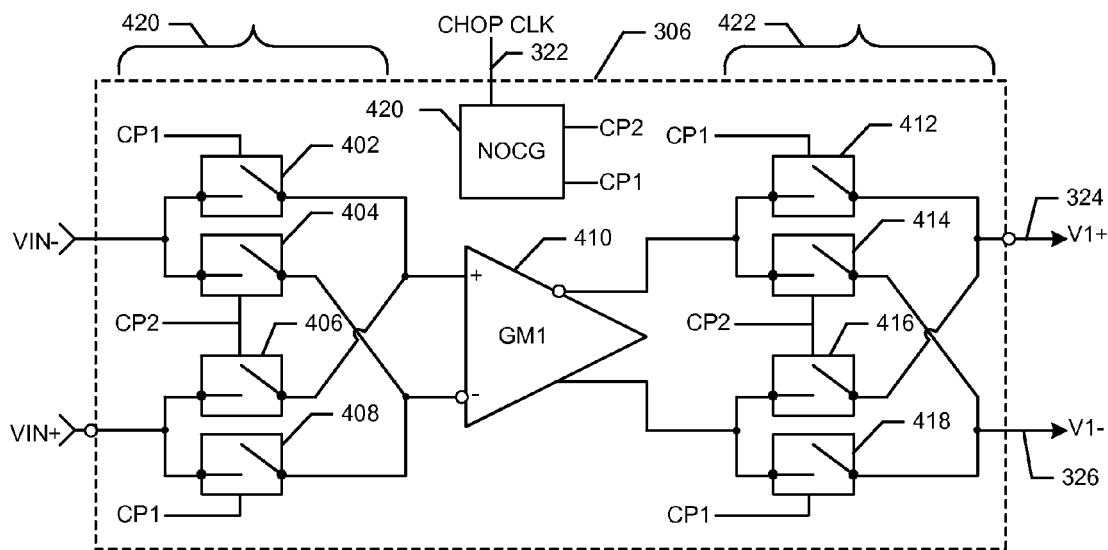
FIG. 4 shows an exemplary detailed embodiment of a chopper amplifier shown in FIG. 3.

FIG. 4 shows an exemplary embodiment of the GM1 amplifier plus chopper circuit 306 shown in FIG. 3. In an exemplary embodiment the GM1 amplifier plus chopper circuit 306 includes an input chopper circuit 420 and an output chopper circuit 422. The input chopper circuit 420 comprises switches 402, 404, 406, and 408. The output chopper circuit 422 comprises switches 412, 414, 416, and 418. In an exemplary embodiment, the switches of the chopper circuits are implemented as transmission gates. The switches 402, 408, 412, and 418 are controlled by a first phase (CP1) of the chop clock 322. The switches 404, 406, 414, and 416 are controlled by a second phase (CP2) of the chop clock 322. For example, when the first phase (CP1) of the chop clock 322 is in a high voltage stage (logic high), the switches 402, 408, 412, and 418 are closed, and when the first phase (CP1) of the chop clock 322 is in a low voltage stage (logic low), the switches 402, 408, 412, and 418 are opened. The switches 404, 406, 414, and 416 are controlled by a second phase (CP2) of the chop clock 322 in a similar fashion.

The chop clock 322 is received at the GM1 amplifier plus chopper circuit 306 and is separated into the phase 1 chop clock (CP1) and the phase 2 chop clock (CP2) utilizing a non-overlapping clock generator (NOCG) 420. An exemplary embodiment and detailed description of the NOCG 420 is provided with reference to FIG. 7. The negative input voltage (VIN−) is received at the input of switches 402 and 404, and the positive input voltage (VIN+) is received at the input of switches 406 and 408. During operation, the switches 402, 404, 406, and 408 open and close in response to the CP1 and CP2 clocks. The output of switch 402 and the output of switch 406 are coupled together at a first input of GM1 amplifier 410. The output of switch 404 and the output of switch 408 are coupled together at a second input of the GM1 amplifier 410. The GM1 amplifier 410 operates to amplify the signals at its input terminals to generate amplified signals at its output terminals. In an exemplary embodiment, the GM1 amplifier 410 comprises a two-stage folded cascade amplifier.

A first output (inverted) of GM1 stage 410 is coupled to inputs of switch 412 and 414. A second output of GM1 stage 410 is coupled at the inputs of switch 416 and 418. During operation, the switches 412, 414, 416, and 418 open and close in response to the CP1 and CP2 clocks. The outputs of switches 412 and 416 are coupled together at the first device output to provide the V1+ 324 signal. The outputs of switches 414 and 418 are couple together at a second device output to provide the V1− 326 signal.

Figure 5:
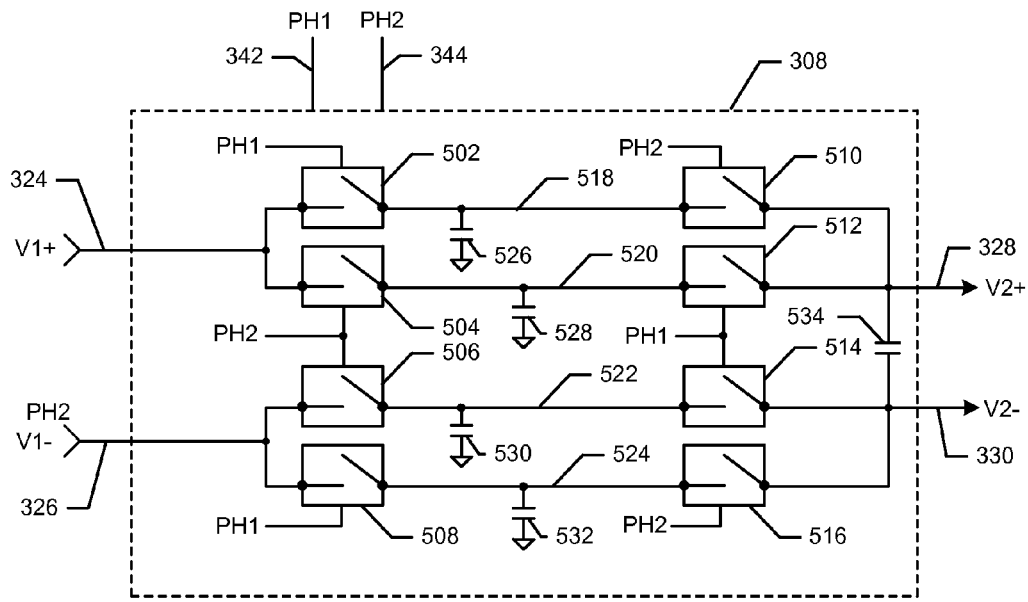
FIG. 5 shows an exemplary detailed embodiment of a switched capacitor filter shown in FIG. 3.

FIG. 5 shows an exemplary detailed embodiment of the switched capacitor filter 308 shown in FIG. 3. The switch capacitor filter 308 comprises switches 502, 504, 506, and 508. The switch capacitor filter 308 also comprises switches 510, 512, 514, and 516. In an exemplary embodiment, the switches of the filter 308 are implemented as transmission gates. The switch capacitor filter 308 receives the first phase (PH1) 342 and the second phase (PH2) 344 of the filter clock output from the filter timing adjuster 304. Each of the switches 502-516 opens and closes in response to the filter clock phase that it receives.

The filter 308 receives the voltage signals (V1+) 324 and (V1−) 326 from the output of the GM1 amplifier plus chopper circuit 306. The V1+ signal 324 is input to the switches 502 and 504. The V1− signal 326 is input to the switches 506 and 508.

The output of switch 502 is input to the switch 510 using signal line 518. The output of switch 504 is input to switch 512 using signal line 520. The output of switch 506 is input to switch 514 using signal line 522. The output 508 is input to switch 506 using signal line 524.

A first capacitor 526 is connected between the signal line 518 and signal ground. A second capacitor 528 is connected between the signal line 520 and the signal ground. A third capacitor 530 is connected between the signal line 522 and the signal ground. A fourth capacitor 532 is connected between the signal line 524 and the signal ground. In an exemplary embodiment, the capacitors shown in FIG. 5 have capacitance values of approximately 4.3 Pico farads.

The outputs of switches 510, 512, 514, and 516 are coupled to first and second outputs of the switch capacitor filter 308. The first output of switch capacitor filter 308 provides the (V2+) 328 voltage output. A second output of switch capacitor 308 provides the (V2−) 330 voltage output. Capacitor 534 is connected between the V2+ 328 and V2− 330 outputs.

During the operation the input voltages 324 and 326 are switch through the filter 308 by the switches 502-516 to charge and discharge the capacitors 536, 528, 530, and 532. The switches are controlled by a first phase (PH1) 342 and a second phase (PH2) 344 of a filter clock. As a result, the output voltages (V2+) 328 and (V2−) 330 are generated and represent filtered versions of the input voltages. In an exemplary embodiment, the filter clocks PH1 and PH2 are phase adjusted with respect to the chop clock 322 by the filter timing adjuster 304 to reduce or eliminate the amount of chopper noise that appears on the output signals 328 and 330.

Figure 6:
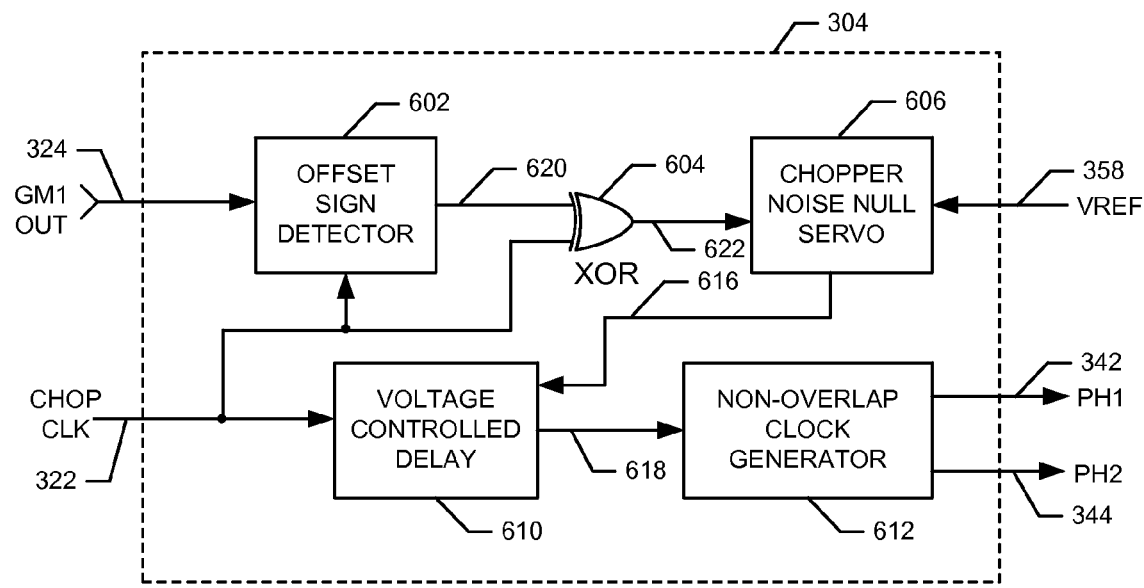
FIG. 6 shows an exemplary embodiment of a filter timing adjuster shown in FIG. 3.

FIG. 6 shows an exemplary embodiment of the filter timing adjuster 304 shown in FIG. 3. In an exemplary embodiment the filter timing adjuster 304 comprises offset sign detector 602, XOR 604, chopper noise null servo 606, voltage controlled delay 610, and non-overlap clock generator 612.

In an exemplary embodiment, the offset sign detector 602 receives the chop clock 322 and the (V1+) 324 output. The offset sign detector 602 operates to generate a polarity indicator 620 that is input to XOR device 604. In an exemplary embodiment, the offset between the inputs of the chopped transimpedance amplifier GM1 306 causes triangular waves at the chop clock frequency at amplifier outputs VII and V1−. Positive polarity dc offsets at VIN+ to VIN− causes triangular waves that ramp upward during PH1 and back down during PH2. Negative polarity offset at VIN+ to VIN− causes triangular waves that ramp down during PH1 and up during PH2. The difference between the voltage at V1+ at the end of PH1 minus the voltage at the end of PH2 will be positive for positive dc offset at VIN+ to VIN−, and the difference will be negative for negative dc offset at VIN+ to VIN−. In an exemplary embodiment the peak to peak amplitude of the triangle wave is approximately 2.5 times the dc offset amplitude.

Thus the triangle wave at V1+ and a chop clock, which locally generates a copy of PH1 and PH2 (denoted PA1 and PA2) can be used to determine the polarity of the dc offset.

The XOR device 604 also receives the chop clock 322 as a second input. The output of the XOR device 604 is a polarity phased servo clock 622 that is an inverted chop clock for one detected polarity of the output of the offset sign detector 602 and a non-inverted chop clock for the other polarity of the output of the offset sign detector 602. In an exemplary embodiment, the XOR gate receives the chop clock 322 and the polarity indicator 620 and outputs the polarity phased servo clock 622 that is adjusted in phase by 0 or 180 degrees to reduce chopper noise for offsets of that polarity.

The chopper noise null servo 606 receives the polarity phased servo clock 622 and the VREF 358 signals and generates a delay control voltage 616 that is input to the voltage control delay 610. In an exemplary embodiment, the chopper noise null servo 606 generates the delay control voltage 616 such that the filter clocks (PH1, PH2) are phase adjusted to reduce chopper noise on the VREF 358 signal.

The voltage controlled delay 610 receives the chop clock 322 and the delay control voltage 616 from the chopper noise null servo 606. The voltage controlled delay 610 delays the chop clock 322 in response to the delay control voltage 616 to generate a delayed chop clock 618.

The non-overlap clock generator 612 receives the delayed chop clock 618 from the voltage control delay 610 and generates the first phase PH1 342 and second phase PH2 344 of the filter clock. The first and second filter clock phases PH1 and PH2 are used to adjust the switch timing of the switch capacitor filter 308 to eliminate or reduce chopper noise on the VREF 358 signal.

Figure 7:
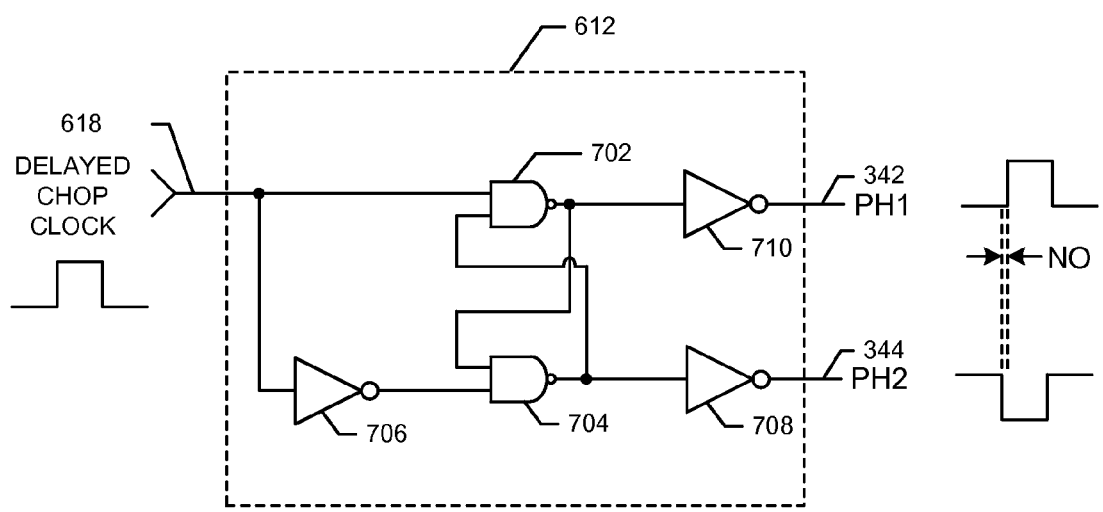
FIG. 7 shows an exemplary detailed embodiment of a non-overlap clock generator shown in FIG. 6.

FIG. 7 shows an exemplary embodiment of the non-overlap clock generator 612 shown in FIG. 6. In an exemplary embodiment the non-overlap clock generator 612 comprises NAND gates 702 and 704. The clock generator 612 also comprises inverters 706, 708, and 710.

The delayed filter clock 618 is received at a first input of NAND gate 702 and a first input of inverter 706. The output of the inverter 706 is input to a first input of NAND gate 704. An output of NAND gate 702 is input to a second input of the NAND gate 704. The output of NAND gate 704 is input to a second input of NAND gate 702.

The output of NAND gate 702 is input to inverter 710 and the output of inverter 710 forms the first phase (PH1) 342 of the filter clock. The output of NAND gate 704 is input to inverter 708 and the output of inverter 708 forms a second phase (PH2) 344 of the filter clock. In an exemplary embodiment, the non-overlap clock generator 612 operates to provide a non-overlap (NO) region at the transitions of the output clock phases. The NO region is in the range of 500 picoseconds to 2-3 nanoseconds or more.

Thus, in various exemplary embodiments the non-overlap clock generator 612 operates to receive the delayed filter clock input 618 and generate multiple non-overlapping clock phases for use by the switch capacitor filter 308.

It should also be noted that the structure of the non-overlapping clock generator 612 is also suitable for use as other non-overlapping clock generators described herein. For example, the non-overlapping clock generator 420 shown in FIG. 4, the non-overlapping clock generator 882 shown in FIG. 8, and the non-overlapping clock generator 964 shown in FIG. 9 can all be implemented using the same circuit structure as the non-overlapping clock generator 612 shown in FIG. 7.

Figure 8:
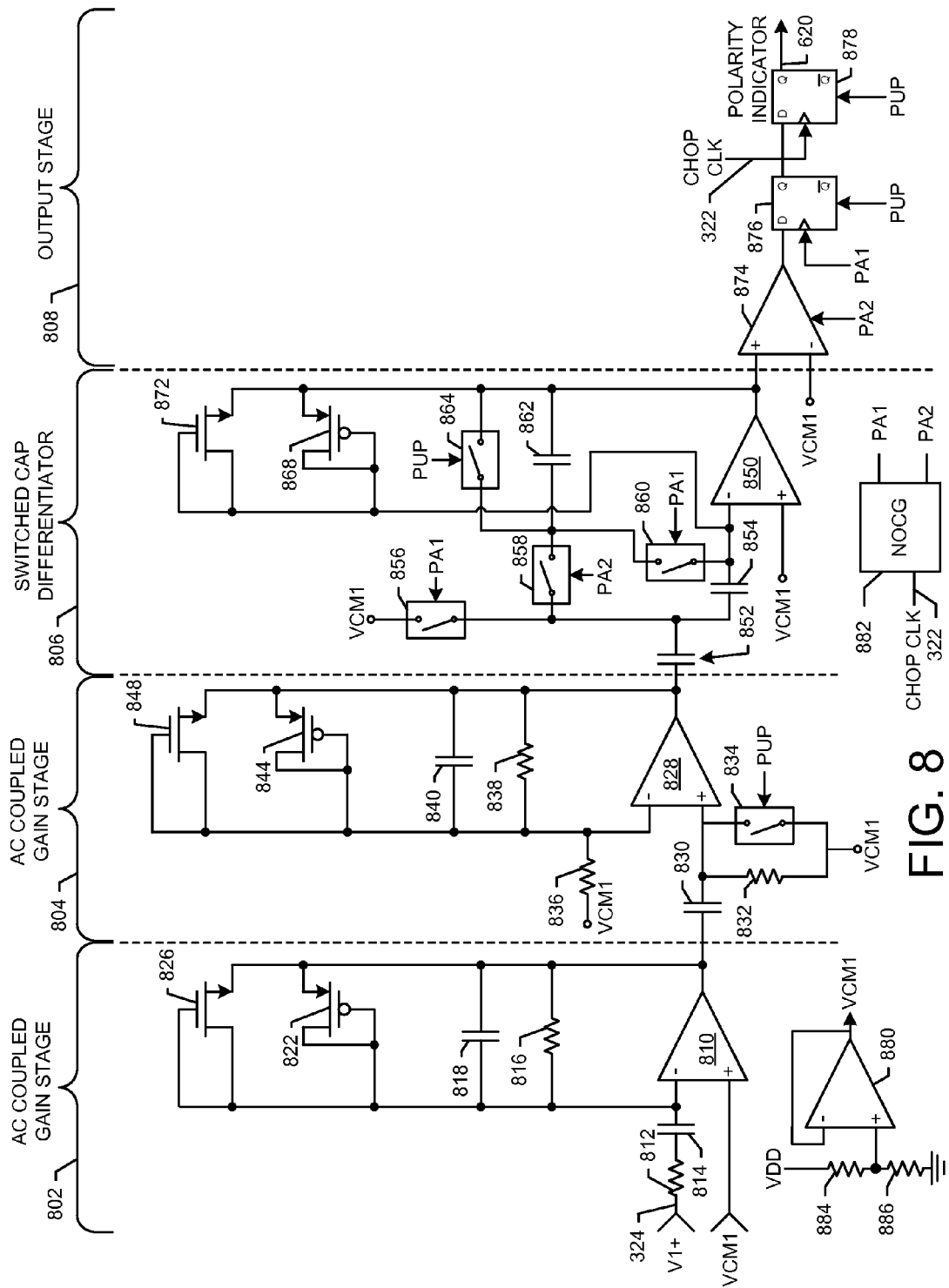
FIG. 8 is an exemplary detailed embodiment of an offset sign detector shown in FIG. 6.

FIG. 8 is an exemplary detailed embodiment of the offset sign detector 602 shown in FIG. 6. In an exemplary embodiment the offset sign detector 602 comprises a first AC coupled gain stage 802, a second AC coupled gain stage 804, a switched capacitor differentiator 806, and an output stage 808. The offset sign detector 602 also comprises a bias amplifier 880 and a non-overlapping clock generator 882. The bias amplifier 880 receives a bias input signal at its non-inverting input. The bias input signal is created by the resistors 884 and 886 that are coupled between VDD and the signal ground. In an exemplary embodiment, the resistors 884 and 886 have identical resistor values, however, in other embodiments, the resistors 884 and 886 have different resistance values. The amplifier 880 generates a first common mode signal (VCM1) at its output and this first common mode signal is input to other sections of the offset sign detector 602 as described below.

In an exemplary embodiment, the non-overlapping clock generator 882 comprises circuitry similar to the non-overlapping clock generator 612 shown in FIG. 7. The NOCG 882 receives the chop clock 322 and generates non-overlapping phases of the chop clock designated (PA1) and (PA2), which are input to other sections of the offset sign detector 602 as described below.

During operation, the offset sign detector 602 receives the V1+ signal 324 and the VCM1 signal and determines the polarity indicator 620 that indicates how the filter clocks (PH1) 342 and (PH2) 344 are to be phase adjusted relative to the chop clock 322 to eliminate or reduce chopper noise on the VREF signal 358.

The first AC coupled gain stage 802 comprises amplifier 810 that has a non-inverting input coupled to receive the VCM1 signal. The voltage V1+ 324 is input to a first terminal of resistor 812. A second terminal of resistor 812 is connected to a first terminal of capacitor 814. A second terminal of capacity 814 is connected to an inverting input terminal of the amplifier 810.

The inverting input terminal of the amplifier 810 is also connected to a first terminal of resistor 816 and a first terminal of capacitor 818. An output terminal of the amplifier 810 is connected to a second terminal of the resistor 816 and a second terminal of the capacitor 818.

A clamping circuit is formed by NMOS transistor 826 and PMOS transistor 822. The output terminal of the amplifier 810 is connected to sources terminals of the transistors 822 and 826. The inverting input of the amplifier 810 is connected to drain and gate terminals of the transistor 822 and 826. The clamping circuit formed by the transistors 822 and 826 operates to clamp the output of the amplifier 810. In an exemplary embodiment, if the output of amplifier 810 is positive it is clamped to approximately the VGS of the PMOS transistor 822. If the output of the amplifier 810 is negative, it is clamped to approximately the VGS of NMOS transistor 826.

In an exemplary embodiment, the first AC coupled gain stage 802 provides a gain of approximately twenty (20) at the chop clock frequency and is AC coupled to remove DC offset.

In an exemplary embodiment the second AC coupled gain stage 804 comprises amplifier 828. The output voltage of the amplifier 810 is connected to a first terminal of capacitor 830. A second terminal of capacitor 830 is connected to a first terminal of resistor 832 and a non-inverting input terminal of the amplifier 828. A switch 834 has first terminal that is connected to the non-inverting input of amplifier 828. A second terminal of the resistor 832 is connected to a second terminal of the switch 834 and also receives the VCM1 signal. The switch 834 also includes a third terminal to receive a power up (PUP) signal that closes the switch when the system power reaches a desired operating level.

The inverting terminal of the amplifier 828 is connected to a first terminal of resistor 836, a first terminal of resistor 838, and a first terminal of capacitor 814. A second terminal of the resistor 836 is connected to receive the VCM1 signal. An output terminal of the amplifier 828 is connected to a second terminal of the resistor 838 and a second terminal of the capacitor 840.

A clamping circuit comprises NMOS transistor 848 and PMOS transistor 844. The output terminal of the amplifier 828 is connected to the source terminals of the transistors 848 and 844. The inverting input terminal of the amplifier 828 is connected to drain and gate terminals of the transistors 848 and 844. The clamping circuit formed by the transistors 848 and 844 operates to clamp the output of the amplifier 828.

In an exemplary embodiment, if the output of amplifier 828 is positive it is clamped to approximately the VGS of the PMOS transistor 844. If the output of the amplifier 828 is negative, it is clamped to approximately the VGS of NMOS transistor 848.

In an exemplary embodiment, the second AC coupled gain stage 804 provides additional gain of approximately thirty-two (32) at the chop clock frequency.

In an exemplary embodiment, the switched capacitor differentiator 806 comprises an amplifier 850. The output terminal of the amplifier 828 is connected to a first terminal of capacitor 852. A second terminal of capacitor 852 is connected to a first terminal of switch 856, a first terminal of switch 858, and a first terminal of capacitor 854. The second terminal of the switch 856 is connected to receive the VCM1 signal. A second terminal of capacitor 854 is connected to an inverting terminal of the amplifier 850 and a first terminal of the switch 860. A non-inverting terminal of the amplifier 850 is connected to receive the VCM1 signal.

A second terminal of the switch 858 is connected to a second terminal of the switch 860. The second terminal of the switch 860 is connected to a first terminal of the capacitor 862 and a first terminal of the switch 864. The switch 858 has a third terminal connected to receive the PA2 clock, the switch 856 has a third terminal connected to receive the PA1 clock, and the switch 860 has a third terminal connected to receive the PA1 clock.

An output of the amplifier 850 is connected to a second terminal of capacitor 862 and a second terminal of the switch 864. The switch 864 also has a third terminal connected to receive the PUP signal, which when active closes the switch 864.

A clamping circuit is formed by NMOS transistor 872 and PMOS transistor 868. The output terminal of the amplifier 850 is connected to source terminals of the transistors 872 and 868. The inverting input of the amplifier 850 is connected to drain and gate terminals of the transistors 872 and 868. The clamping circuit formed by the transistors 872 and 868 operates to clamp the output of the amplifier 850. In an exemplary embodiment, if the output of amplifier 850 is positive it is clamped to approximately the VGS of the PMOS transistor 868. If the output of the amplifier 850 is negative, it is clamped to approximately the VGS of NMOS transistor 872.

In an exemplary embodiment, the switched capacitor differentiator 806 takes a sample on phase PA1 and a sample on phase PA2 and subtracts the difference while providing a gain of approximately three (3) and removing offset from the input signal utilizing correlated double sampling offset removal.

In an exemplary embodiment, the output stage 808 comprises low offset clocked comparator 874, D-type flip-flop 876, and D-type flip-flop 878. The output terminal of the amplifier 850 is connected to a non-inverting terminal of the comparator 874. An inverting input terminal of the comparator 874 is connected to receive the VCM1 signal. The comparator 874 also receives the PA2 clock, which operates to clock the comparator output signal.

An output terminal of the comparator 874 is connected to a D input of flip-flop 876, and a Q output of flip-flop 876 is connected to a D input of flip-flop 878. The PA1 clock is input to the clock terminal of flip-flop 876. The flip-flop 878 receives the chop clock 822 at its clock terminal. The flip-flops 876 and 878 also receive the PUP signal at their reset inputs. The PUP signal operates to allow the flip-flops 876 and 878 to operate when power is established. The output of the flip-flop 878 is the polarity indicator 620.

During operation, the comparator 874 latches the difference signal output from the switched capacitor differentiator 806 using the PA2 clock. After settling, the flip-flop 876 latches in response to the PA1 clock. The output of the flip-flop 876 is then resynced with the chop clock 322 to generate polarity indicator 620.

Figure 9:
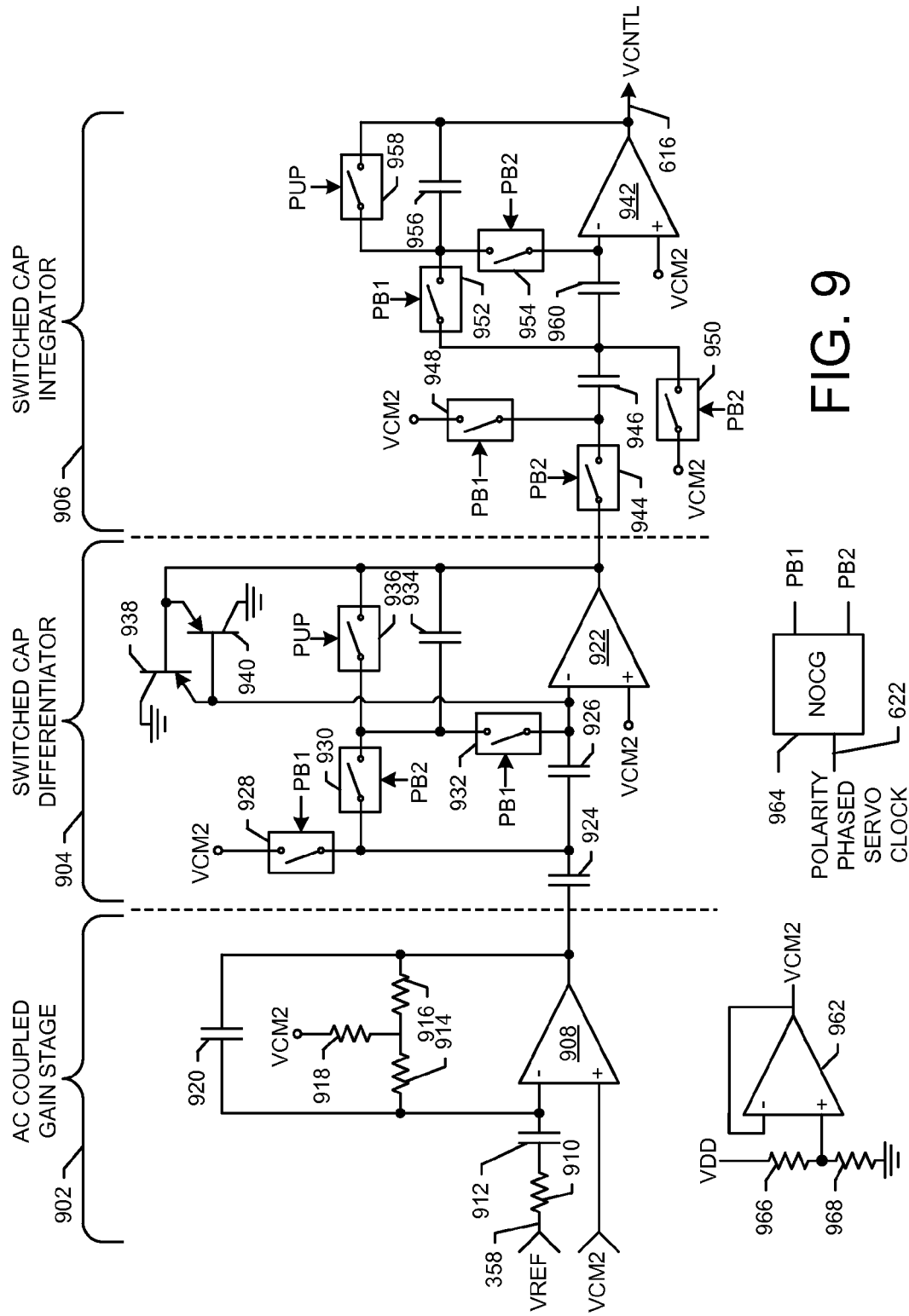
FIG. 9 is an exemplary detailed embodiment of a chopper noise null servo shown in FIG. 6.

FIG. 9 shows an exemplary detailed embodiment of the chopper noise null servo 606 shown in FIG. 6. In an exemplary embodiment the chopper noise null servo 606 comprises an AC coupled gain stage 902, a switch capacitor differentiator 904, and a switch capacitor integrator 906. The chopper noise null servo 606 also includes bias amplifier 962 and NOCG 964.

The bias amplifier 962 receives a bias input signal at its non-inverting input. The bias input signal is created by the resistors 966 and 968 that are coupled between VDD and the signal ground. In an exemplary embodiment, the resistors 966 and 968 have identical resistance values, however, in other embodiments, the resistors 966 and 968 have different resistance values. The amplifier 962 generates a second common mode signal (VCM2) at its output and this second common mode signal is input to other sections of the chopper noise null servo 606 as described below.

In an exemplary embodiment, the non-overlapping clock generator 964 comprises circuitry similar to the non-overlapping clock generator 612 shown in FIG. 7. The NOCG 964 receives the polarity phased servo clock 622 and generates non-overlapping phases of the polarity phased servo clock 622 that are designated (PB1) and (PB2), which are input to other sections of the chopper noise null servo 606 as described below.

In an exemplary embodiment, the chopper noise null servo 606 operates to receive the VREF 358 and VCM2 signals and generates the delay control signal (VCNTL) 616, which controls phase adjustment of the PH1 and PH2 filter clocks relative the chop clock 322 to eliminate or reduce chopper noise on the VREF 358 signal.

In an exemplary embodiment, the AC coupled gain stage 902 receives the VREF 358 and VCM2 signals and provides an AC gain of approximately (×250) around the chop clock frequency. The switched capacitor differentiator 904 takes the difference between the voltage at the output of amplifier 908 at phase PB1 and the voltage at phase PB2 and provides an amplified difference signal at the output of amplifier 922. The switched capacitor integrator 906 performs a cumulative sum of those differences. Initially, the differences may be large but will step closer and closer to a settling point.

In an exemplary embodiment, the AC coupled gain stage 902 comprises amplifier 908 that receives the VCM2 signal at a non-inverting input terminal. The VREF signal 358 is received at a first terminal of resistor 910. A second terminal of the resistor 910 is connected to a first terminal of capacitor 912. A second terminal of capacitor 912 is connected to an inverting input of the amplifier 908.

The inverting input terminal of the amplifier 908 is connected to a first terminal of resistor 914 and a first terminal of capacitor 920. A second terminal of the resistor 914 is connected to a first terminal of resistor 918 and a first terminal of resistor 916. A second terminal of resistor 918 is connected to receive the VCM2 signal. An output of the amplifier 908 is connected to a second terminal of resistor 916 and a second terminal of capacitor 920. During operation, the AC coupled gain stage 902 provides a gain of at least two hundred (200) at the frequency of the chop clock 322.

In an exemplary embodiment, the switched capacitor differentiator 904 comprises amplifier 922 having a non-inverting input terminal connected to receive the VCM2 signal. The output of the amplifier 908 is input to a first terminal of capacitor 924. A second terminal of capacitor 924 is connected to a first terminal of switch 928, a first terminal of switch 930, and a first terminal of capacitor 926.

A second terminal of switch 928 is connected to receive the VCM2 signal and a third terminal of the switch 928 is connected to receive the PB1 clock. A second terminal of capacitor 926 is connected to a first terminal of switch 932 and an inverting input terminal of the amplifier 922. A second terminal of the switch 930 is connected to a second terminal of switch 932, a first terminal of switch 936, and a first terminal of capacitor 934.

Amplifier 922 has an output terminal that is connected to a second terminal of capacitor 934, a second terminal of switch 936. The switch 928 and the switch 932 are opened and closed in response to the PB1 clock signal. Switch 930 is open and closed in response to the PB2 clock signal. The switch 936 is open and closed in response to the PUP signal.

A clamping circuit is formed by PNP bipolar transistor 938 and PNP bipolar transistor 940. The output terminal of the amplifier 922 is connected to an emitter terminal of transistor 940 and a base terminal of transistor 938. Collector terminals of the transistors 938 and 940 are connected to signal ground. An emitter terminal of transistor 938 and a base terminal of transistor 940 are connected to the inverting input of the amplifier 922. The clamping circuit formed by the transistors 938 and 940 operates to clamp the output of the amplifier 922. In an exemplary embodiment, if the output of the amplifier 922 is positive, the output is clamped to approximately the VBE of transistor 940. If the output of amplifier 922 is negative, the output is clamped to approximately the VBE of transistor 938.

In an exemplary embodiment, the switched capacitor differentiator 904 provides a gain of approximately fourteen (14), and correlated double sampling offset removal. The switched cap differentiator 904 computes V(PH1)–V(PH2) which serves as a synchronous detector for voltage changes between PH1 and PH2, indicative of chopper noise.

In an exemplary embodiment the switch capacitor integrator 906 comprises amplifier 942 that has a non-inverting input terminal connected to receive the VCM2 signal. An output of amplifier 922 is connected to a first terminal of switch 944. A second terminal of the switch 944 is connected to a first terminal of switch 948, and a first terminal of capacitor 946. A second terminal of capacitor 946 is connected to a first terminal of switch 950, a first terminal of switch 952 and a first terminal of capacitor 960.

A second terminal of capacitor 960 is connected to a first terminal of switch 954 and an inverting input of amplifier 942. A second terminal a switch 950 is connected to receive the VCM2 signal. A second terminal of switch 954 is connected to a second terminal of switch 952, a first terminal of switch 958, and a first terminal of capacitor 956. And output terminal of amplifier 942 is connected to a second terminal of capacitor 956 and a second terminal of capacitor 958. The output terminal of the amplifier 942 also outputs the VCNTL signal 616.

The switch 948 and the switch 952 are opened and closed in response to the PB1 signal. The switch 950, the switch 954, and the switch 944 are open and closed in response to the PB2 signal. The switch 958 is normally open and thereafter closed when the PUP signal is active.

In an exemplary embodiment, the switched capacitor integrator 906 provides a gain of approximately ($\frac{1}{12}$) and correlated double sampling offset removal. Integrator 906 generates a cumulative sum of the output of the differentiator 904, which is then output as VCNTL 616. When the chopper noise is large the integrator will generate large steps in VCNTL 616 to quickly begin to reduce the chopper noise. As the chopper noise is reduced the integrator generates smaller and smaller steps in VCNTL 616. If the loop should start up with too much VCNTL 616 the differentiator will generate an output opposite to the usual sign and the integrator will generate steps in the negative direction until the correct VCNTL 616 has been reached and the loop settles.

In an exemplary embodiment, the switched capacitor differentiator 904 and integrator 906 will generate a VCNTL voltage 616 that increases or decreases when there is a positive step voltage at VREF voltage during chopper noise null servo clock phase CP1 depending upon the polarity indicator 620. The correct polarity will cause the differentiator 904 and integrator 906 to generate a VCNTL 616 signal that exhibits negative feedback, which is desired. The wrong polarity will cause differentiator 904 and integrator 906 to generate a VCNTL 616 that exhibits positive feedback within the chopper servo null loop and the chopper servo null loop may increase, not decrease, chopper noise at the VREF output.

Figure 10:
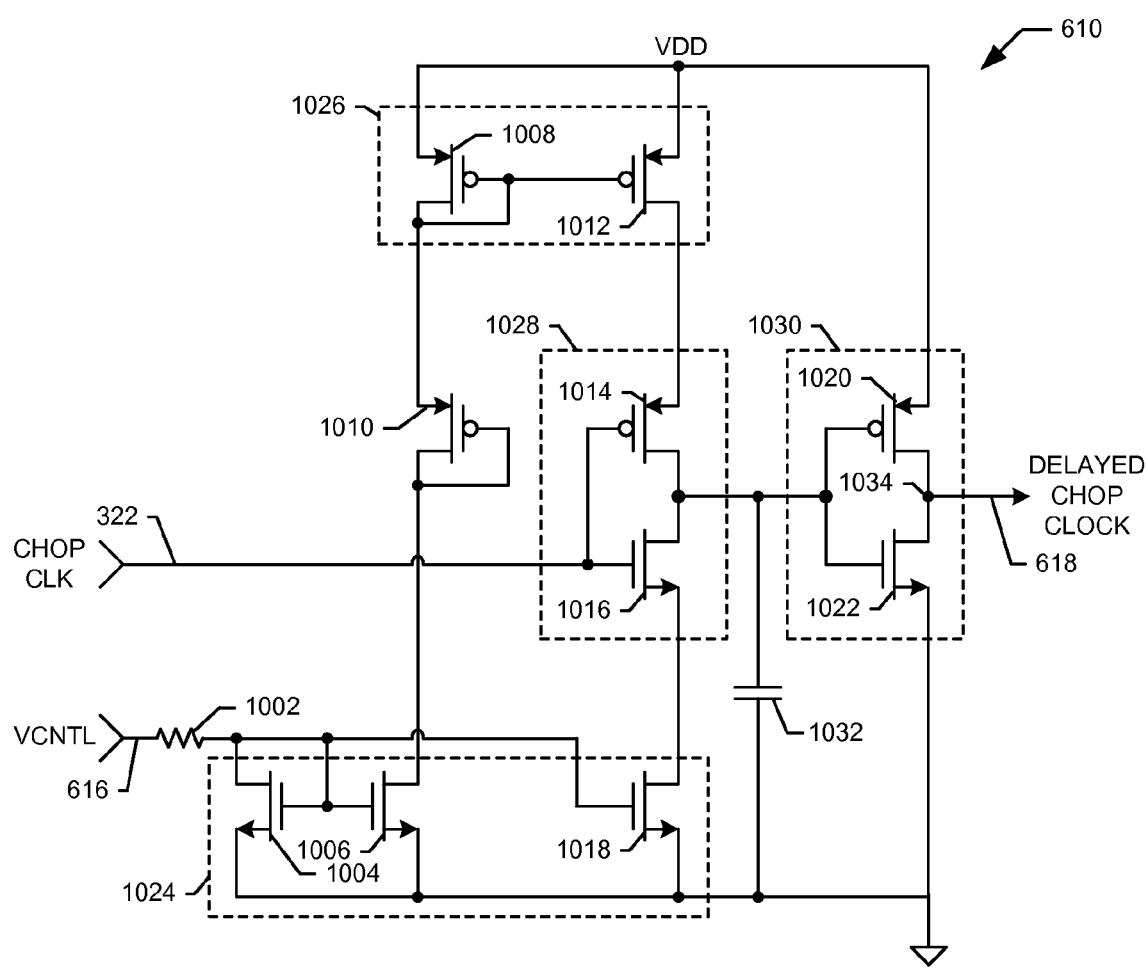
FIG. 10 is an exemplary detailed embodiment of a voltage controlled delay shown in FIG. 6.

FIG. 10 shows an exemplary detailed embodiment of the voltage controlled delay 610 shown in FIG. 6. In an exemplary embodiment, the chop clock 322 is input into a gate terminal of transistor 1016 and a gate terminal of transistor 1014, which form inverter buffer 1028. The delay control signal (VCNTL) 616 is received and input to a first terminal of resistor 1002. A second terminal of the resistor 1002 is connected to a drain terminal of transistor 1004, a gate terminal of transistor 1004, a gate terminal of transistor 1006, and a gate terminal of transistor 1018. The transistors 1004, 1006, and 1008 form current mirror 1024. Source terminals of transistors 1004, 1006, and 1018 are connected to a signal ground. A drain terminal of transistor 1006 is connected to drain and gate terminals of transistor 1010. A source terminal of transistor 1010 is connected to drain and gate terminals of transistor 1008. A source terminal of transistor 1008 is connected to a supply voltage (VDD).

The gate terminal transistor 1008 is connected to a gate terminal of transistor 1012. A source terminal of the transistor 1012 is connected to the supply voltage and a drain terminal of the transistor 1012 is connected to a source terminal of transistor 1014. The transistors 1008 and 1012 form current mirror 1026. A drain terminal of transistor 1014 is connected to a drain terminal of transistor 1016. A source terminal of transistor 1016 is connected to a drain terminal of transistor 1018.

A drain terminal of transistor 1014 is connected to gate terminals of transistors 1020 and 1022, which form inverter buffer 1030. Capacitor 1032 has a first terminal connected to the drain terminal of transistor 1014 and a second terminal connected to the signal ground. A source terminal of transistor 1020 is connected to the supply voltage and a source terminal of transistor 1022 is connected to the signal ground. Drain terminals of the transistors 1020 and 1022 are connected together at an output node 1034 and the delayed filter clock signal 618 is output from the output node 1034. In an exemplary embodiment, the resistor 1002 has a resistance of approximately 85 KOhm and the capacitor 1032 has a capacitance value of approximately 0.12 Pico farads.

During operation, the VCNTL voltage signal 616 is converted to a current by resistor 1002 and this current signal is input to the current mirror 1024. The current flowing through transistor 1006 is mirrored by the current flowing through transistors 1004 and 1018. The current flowing through transistor 1006 also flows through transistor 1008 and this current is mirrored by the current flowing through the transistor 1012.

The chop clock 322 is input to the inverter buffer 1028, which acts like a switch to allow current to flow through transistor 1014 to the capacitor 1032 or from the capacitor through transistor 1016. Thus, the capacitor 1032 effectuates a delay. A triangle waveform is generated at the node that is common to the drains of the transistors 1014 and 1016. The inverter buffer 1030 then converts this triangle wave to the delayed filter clock 618.

Figure 11:
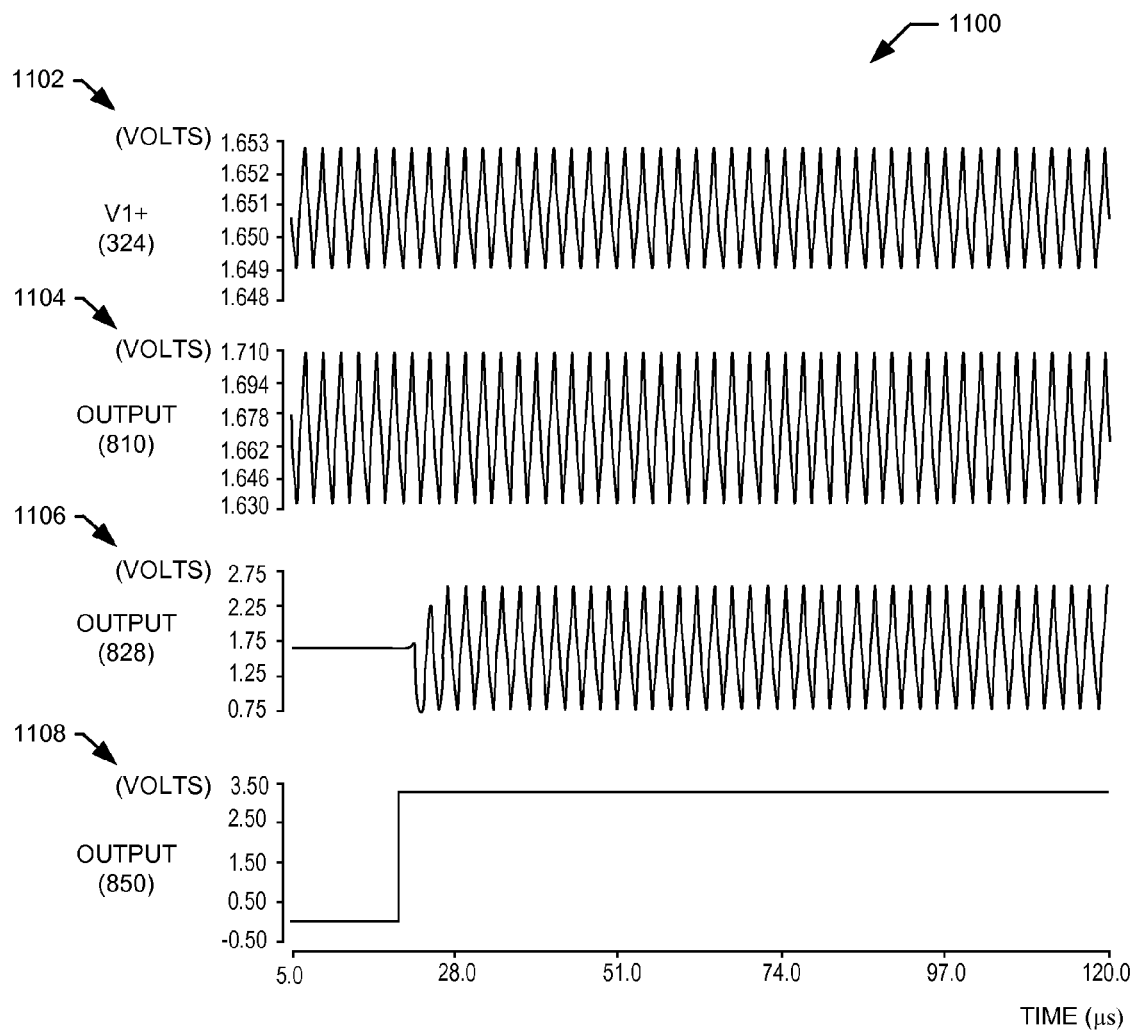
FIG. 11 shows timing diagrams that illustrate the operation of the offset sign detector shown in FIG. 6.

FIG. 11 shows timing diagrams that illustrate the operation of the offset sign detector 602 shown in FIG. 6. During operation, the V1+ 324 signal shown at 1102 is received at the first AC coupled gain stage 802. The signal is amplified as discussed above and the output of the amplifier 810 is shown at 1104. This signal is then input to the second AC coupled gain stage 804 and the output of the amplifier 828 is shown at 1106. The output of the second AC coupled gain stage 804 is input to the switched capacitor differentiator 806 and the output of amplifier 850 is shown at 1108. This output represents the polarity indicator 620. It should be noted that the power up process holds the output of amplifier 850 low for approximately the first 22 microseconds.

Figure 12:
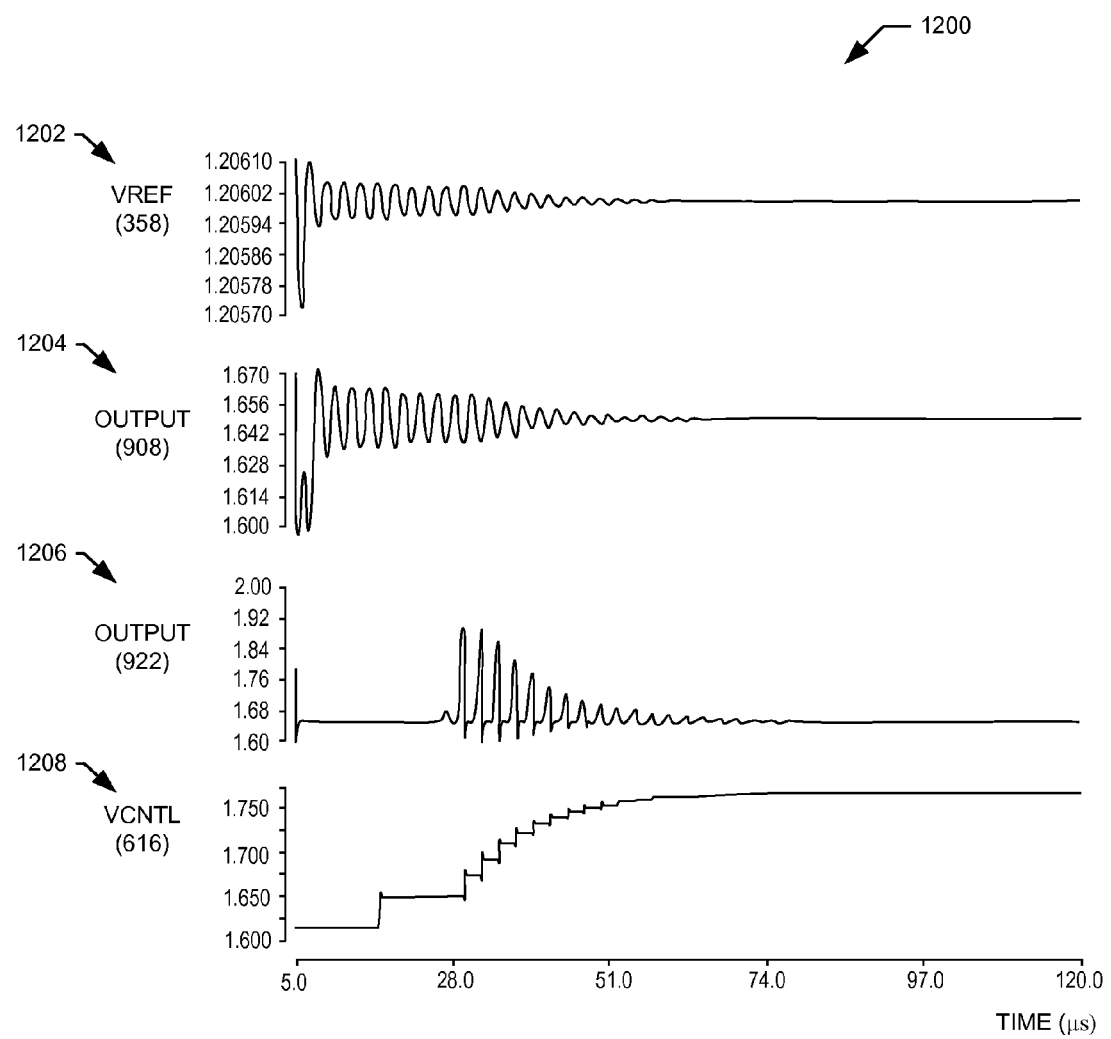
FIG. 12 shows timing diagrams that illustrate the operation of the chopper noise null servo shown in FIG. 6.

FIG. 12 shows timing diagrams that illustrate the operation of the chopper noise null servo 606 shown in FIG. 6. During operation, the VREF 358 signal shown at 1202 is input to the first AC coupled gain stage 902. The output of the first AC coupled gain stage is provided at the output of the amplifier 908, which is shown at 1204. The output of the amplifier 908 is input to the switched capacitor differentiator 904, which generates an amplified difference between the first and second clock phases (P2A, P2B). This difference is provided at the output of the amplifier 922 and shown at 1206. The output of the amplifier 922 is input to the switched capacitor integrator 906. The switch capacitor integrator 906 generates the VCNTL signal 616 at the output of the amplifier 942, which is shown at 1208.

Figure 13:
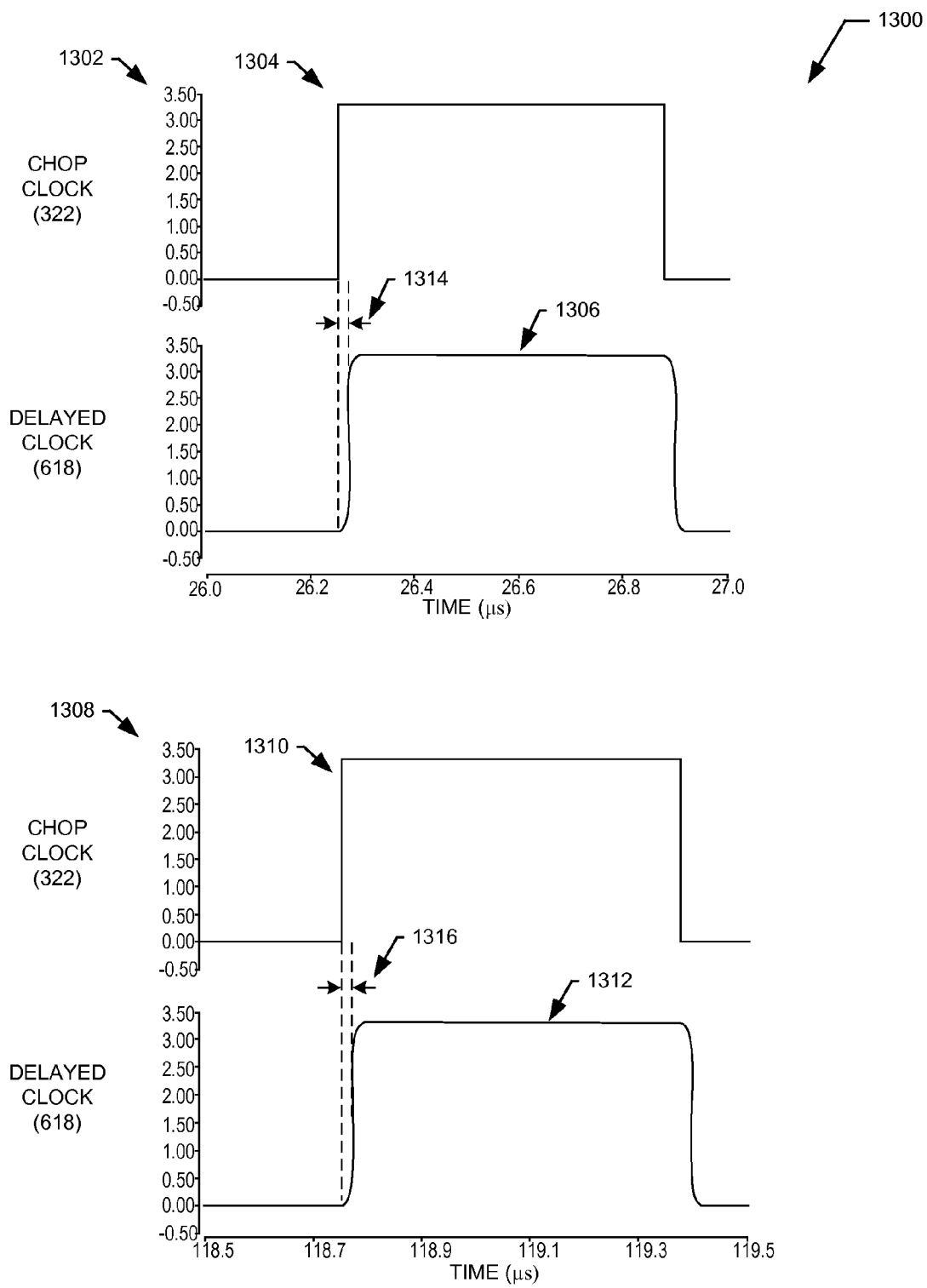
FIG. 13 shows timing diagrams that illustrate how a chop clock is delayed to generate the filter clocks that reduce chopper noise on an output voltage signal.

FIG. 13 shows timing diagrams that illustrate how the chop clock 322 is adjustably delayed to generate the filter clocks that reduce chopper noise on the VREF signal. In a first graph 1302, the chop clock 322 is shown at 1304. In the early stages of operation (e.g., 20 microseconds after startup) the chop clock 322 is delayed to generate a delayed chop clock 618 (shown at 1306) that is used to generate the filter clocks (PH1, PH2). As can be seen in graph 1302 the initial delay 1314 is approximately 21 nanoseconds.

In a second graph 1308, the chop clock 322 is shown at 1310. After approximately 100 microseconds of operation, the chop clock 322 is adjustably delayed by the generation of the VCNTL signal to generate a delayed chop clock 618 (shown at 1312) that is used to generate the filter clocks (PH1, PH2). As can be seen in graph 1308 the delay 1316 has changed to approximately 19 nanoseconds. The system will thereafter continuously adjust the delay to reduce chopper noise on the output of the filter 308 and thus on the VREF signal.

Figure 14:
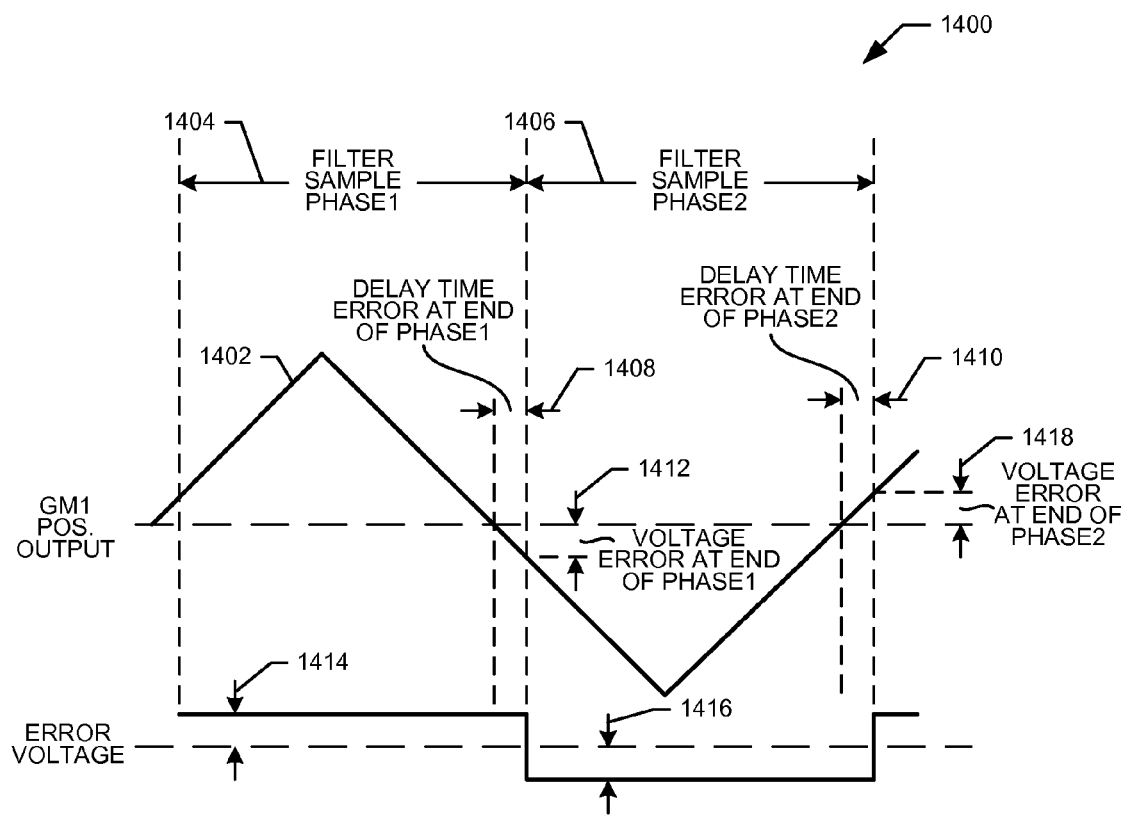
FIG. 14 shows a graph that illustrates the overall operation of an exemplary embodiment of a chopper stabilized amplifier with synchronous switched capacitor noise filtering to adjust the timing of the filter clocks relative to the chop clock to reduce chopper noise on an output voltage signal.

FIG. 14 shows a graph that illustrates the overall operation of the CSA 102 to adjust the timing of the filter clocks relative to the chop clock to reduce chopper noise on the VREF signal. As illustrated in FIG. 14, the positive output of the GM1 stage 306 is a triangle waveform 1402 that is input to the switched capacitor filter 308. The switched capacitor filter 308 operates in response to the first (PH1) and second (PH2) filter clocks, which operate in the regions 1404 and 1406, respectively. As illustrated in FIG. 14, the filtering does not align with the triangle wave's passage through ground, a small error voltage results, which is illustrated at 1412 and 1418. During operation of the CSA 102, the filter clocks are adjustably delayed such that the filtering during phase 1 and phase 2 aligns with the triangle wave's passage through ground. For example, the filter clocks are adjusted by the time delays shown at 1408 and 1410. The adjustment to the delay of the filter clock phases results in a reduction in the delay time error and shrinks the corresponding voltage error, during both filter phases. For example, the error voltages 1414 and 1416 represent a square wave error voltage that appears on the filter output during both phases, and which is gradually reduced as the filter clocks (PH1, PH2) are time adjusted. As a result, the chopper noise on the VREF signal is reduced.

Figure 15:
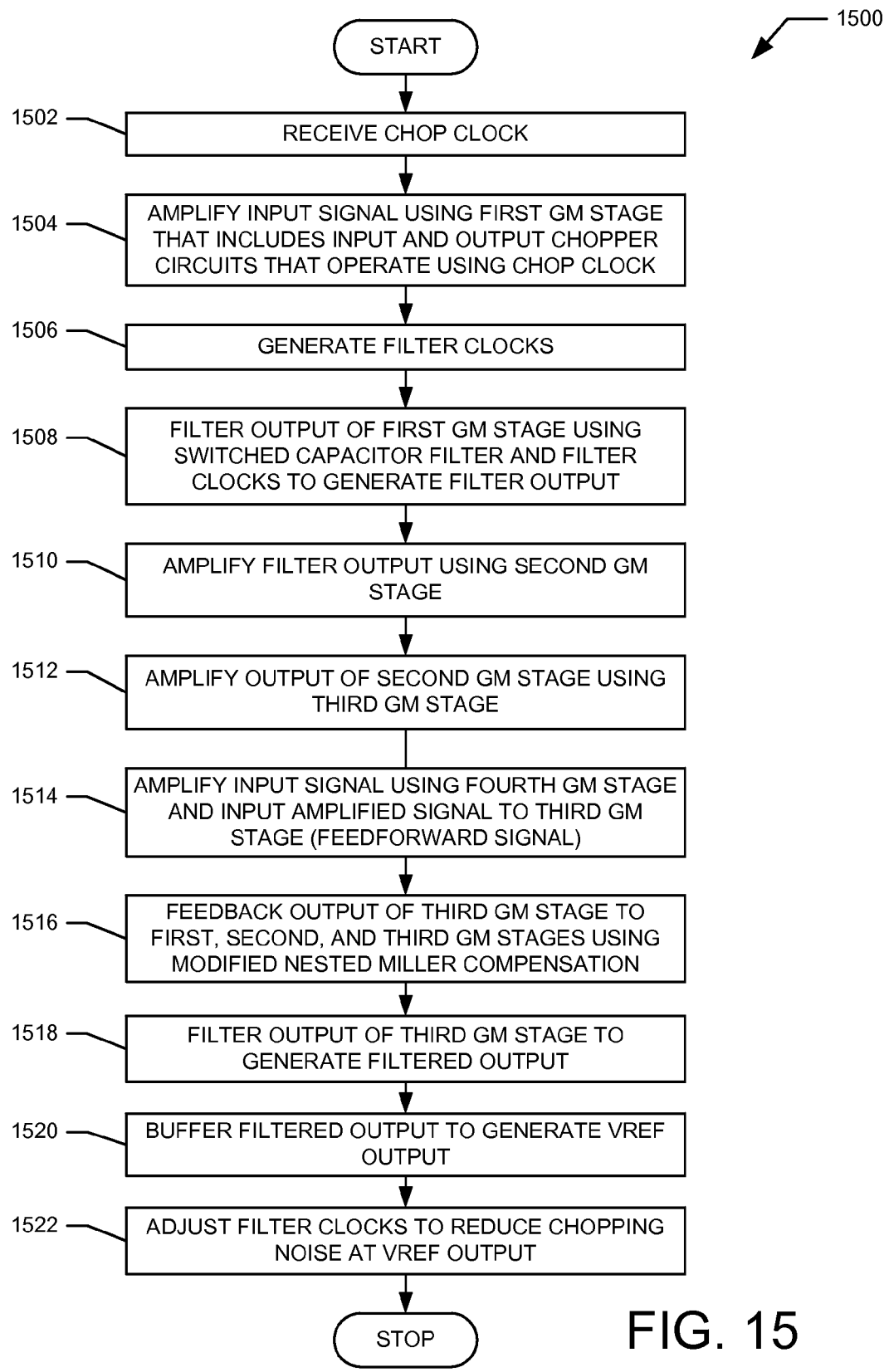
FIG. 15 shows a method for operating an exemplary embodiment of a chopper stabilized amplifier with synchronous switched capacitor noise filtering to reduce chopper noise on an output signal.

FIG. 15 shows a method 1500 for operating an exemplary embodiment of a chopper stabilized amplifier with synchronous switched capacitor noise filtering to reduce chopper noise on the output signal. In an exemplary embodiment, the method is suitable for use with the CSA 102 shown in FIG. 3.

At block 1502, a chop clock is received. In an exemplary embodiment the chop clock 322 is received by the CSA 102 shown in FIG. 2 and FIG. 3.

At block 1504, an input signal is amplified using a first GM stage that includes input and output chopper circuits that operate using the received chop clock. For example, the chopped GM stage 306 amplifies the input voltages (VIN+, VIN−) to generate an output signal (V1+) 324 and (V1−) 326 using input (420) and output (422) chopping circuits and the GM stage 410.

At block 1506, switched capacitor filter clocks are generated. In an exemplary embodiment the non-overlapping clock generator 612 generates the switched capacitor filter clocks (PH1, PH2) based on a delayed version of the chop clock 322.

At block 1508, the output of the chopped GM stage is filtered by a switched capacitor filter using the filter clocks generated at block 1506. In an exemplary embodiment the output (V1+, V1−) of the chopped GM stage 306 is filtered using the switch capacitor filter 308 that operates utilizing the filter clocks (PH1, PH2) to generate a filtered output (V1F+, V1F−).

At block 1510, the outputs of the switched capacitor filter are amplified using a second (GM) stage. In an exemplary embodiment, the outputs (V1F+, V1F−) of the switch capacitor filter 308 are amplified using the GM2 stage 310 to generate outputs (V2+) 332 and (V2−) 334.

At block 1512, the outputs of the GM2 stage are amplified using a 3rd (GM) stage. In an exemplary embodiment, the outputs (V2+, V2−) from the GM2 stage 310 are input to the GM3 stage 315 to generate an amplified (V3) output signal 336.

At block 1514, the input voltages are amplified by a fourth (GM) stage to generate amplified voltages that are input to the GM3 stage. In an exemplary embodiment, the input voltages (VIN+, VIN−) are input and amplified by the GM4 stage 318 to generate amplified voltages (V4+) 346 and (V4−) 348 that are input to the GM3 stage 312. The signals V4+ and V4− represent feedforward signals to the GM3 stage.

At block 1516, the output of the GM3 stage is fed back to previous GM stages utilizing a modified nested miller compensation circuit. In an exemplary embodiment, the output (V3) 336 of the GM3 stage 312 is input to the modified nested miller compensation circuit 320. The capacitor 354 provides a feedback path to the input of the GM3 stage 312. The capacitor 352 forms a feedback path to the input of the GM2 stage 310. The capacitor 350 forms a feedback path to the input of the filter 308. The capacitor 356 couples the non-inverting input terminal of the GM3 stage 312 to the signal ground.

At block 1518, the output of the GM3 stage is filtered using a low pass filter. In an exemplary embodiment, the (V3) output 336 of the GM3 stage 312 is filtered using the single pole filter 314 to generate the filter output 338.

At block 1520, the output of the single pole filter is buffered to generate the voltage reference signal (VREF). In an exemplary embodiment, the output 338 of the filter 314 is buffered by the wideband buffer 316 to generate the reference voltage (VREF) signal 358.

At block 1522, the filter clocks that are input to the switch capacitor filter are adjusted to reduce chopper noise on the VREF signal. In an exemplary embodiment, the filter timing adjuster 304 adjusts the phases of the filter clocks (PH1 and PH2) with respect to the chop clock 322 to reduce the level of chopping noise that appears in the VREF signal. A more detailed description of the operations performed at block 1522 is provided in the description of the method 1600 shown in FIG. 16.

Figure 16:
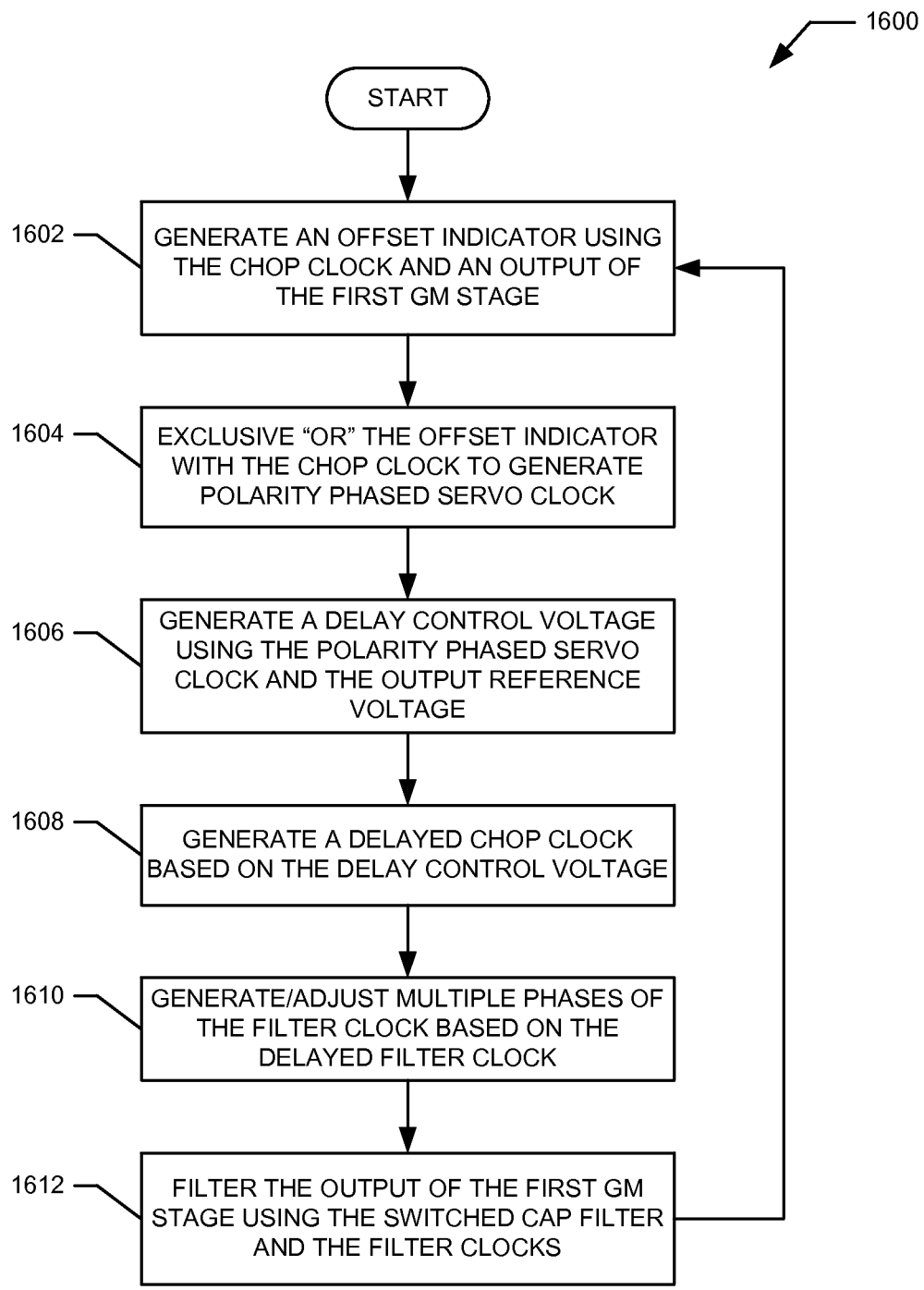
FIG. 16 shows an exemplary method for operating a filter timing adjuster in a chopper stabilized amplifier with synchronous switched capacitor noise filtering to reduce chopper noise on an output signal.

FIG. 16 shows an exemplary method 1600 for operating a filter timing adjuster in a chopper stabilized amplifier with synchronous switched capacitor noise filtering to reduce chopper noise on the output signal. In an exemplary embodiment, the method is suitable for use with the filter timing adjuster 304 shown in FIG. 6. In an exemplary embodiment, the method 1600 is suitable for use at block 1522 of the method 1500.

At block 1602, an offset indicator is generated using the chop clock and an output of the first GM stage. In an exemplary embodiment, the offset sign detector 602 operates to receive the chop clock 322 and the V1+ 324 output of the GM1 stage 306 and generates the polarity indicator 620 as described above.

At block 1604, the polarity indicator is gated with the chop clock using an XOR gate to generate a polarity phased servo clock. In an exemplary embodiment, the polarity indicator 620 and the chop clock 322 are input to XOR 604. The XOR 604 generates the polarity phased servo clock 622 at its output port.

At block 1606, a delay control voltage is generated using the polarity phase servo clock and the output reference voltage VREF. In an exemplary embodiment, the chopper noise null servo 606 received the polarity phased servo clock 622 and the reference voltage VREF 358 and generates the delay control voltage 616.

At block 1608, a delayed chop clock is generated based on the delay control voltage. In an exemplary embodiment, the voltage controlled delay 610 receives the chop clock 322 and the delay control voltage 616 and generates the delayed chop clock 618.

At block 1610, multiple phases of the filter clock are generated (or adjusted) using the delayed chop clock. In an exemplary embodiment, the non-overlap clock generator 612 received the delayed chop clock 618 and generates multiple phases (PH1 342, PH2 344) of the filter clock.

At block 1612, the output of the GM stage 306 is filtered using the switch capacitor filter that is operated utilizing the filter clocks. In an exemplary embodiment switched capacitor filter 308 receives the output of the first GM stage 306 and filters this output utilizing the filter clocks PH1 340 and PH2 344. By utilizing the filter clocks the amount of chopper noise that appears at the output voltage reference VREF is eliminated or reduced. In an exemplary embodiment, the phase/timing of the filter clocks PH1 340 and PH2 344 are continually adjusted by operation of the method 1600 such that the reduced chopper noise level on the VREF signal 358 is maintained. In an exemplary embodiment, the method continues at block 1602.

Figure 17:
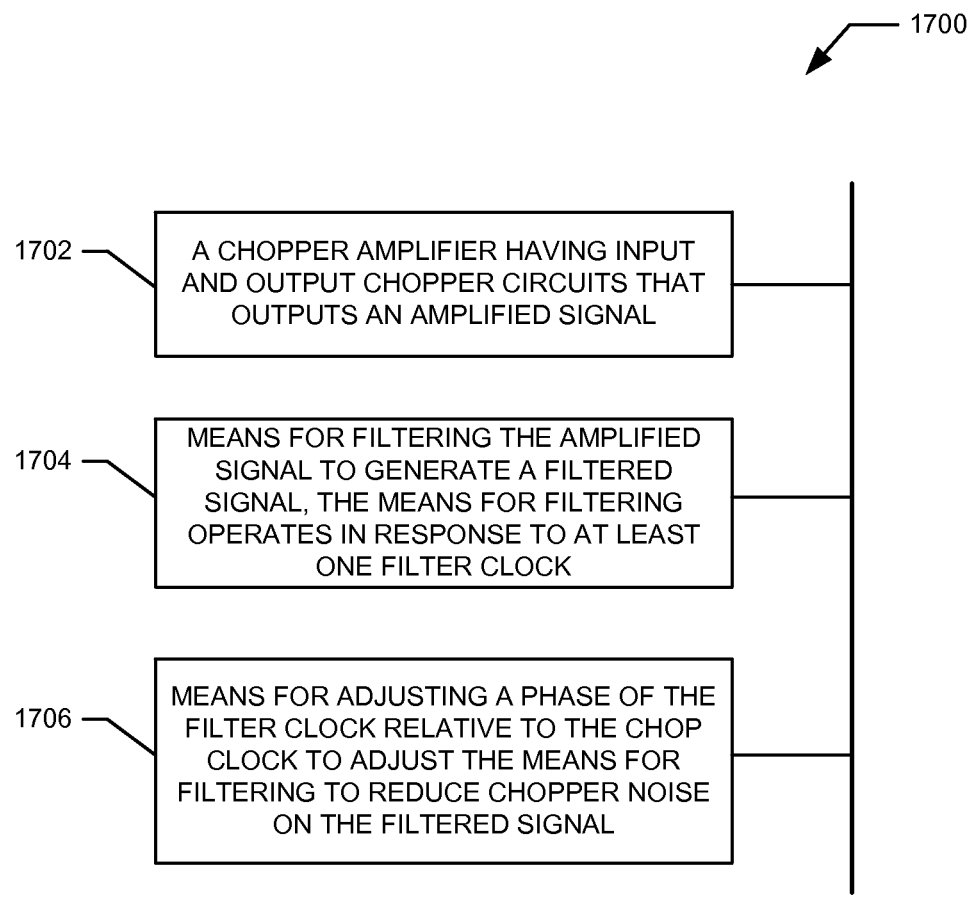
FIG. 17 is an exemplary embodiment of a chopper stabilized amplifier apparatus that generates and output with reduced chopper noise.

FIG. 17 is an exemplary embodiment of a chopper stabilized amplifier apparatus 1700 that generates an output with reduced chopper noise. For example, the apparatus 1700 is suitable for use as the CSA 102 shown in FIG. 3.

The apparatus 1700 comprises a chopper amplifier having an input that receives an input signal and an output that outputs an amplified signal. The chopper amplifier includes an input chopping circuit coupled to the input and an output chopping circuit coupled to the output, the input and output chopping circuits operate in response to a chop clock. In an exemplary embodiment, the chopper amplifier comprises the GM1 amplifier plus chop circuit 306.

The apparatus 1700 also comprises a first means (1704) for means for filtering the amplified signal to generate a filtered signal. The means for filtering operates in response to at least one filter clock. In an exemplary embodiment, the means for filtering comprises a switched capacitor filter operated with filter clocks. For example, the means for filtering 1704 comprises the switched capacitor filter 308.

The apparatus 1700 also comprises a second means (1706) for adjusting a phase of the filter clock relative to the chop clock to adjust the means for filtering to reduce chopper noise on the filtered signal. In an exemplary embodiment, the means 1706 comprises the filter timing adjuster 304.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. An apparatus comprising:
   a chopper amplifier having an input that receives an input signal and an output that outputs an amplified signal, the chopper amplifier includes an input chopping circuit coupled to the input and an output chopping circuit coupled to the output, the input and output chopping circuits operate in response to a chop clock;
   a switched capacitor filter having an input that receives the amplified signal and an output that outputs a filtered signal, the switched capacitor filter operates in response to at least one filter clock; and
   a filter timing adjuster having an input to receive a reference voltage and the chop clock, and an output to output the at least one filter clock, the filter timing adjuster adjusts a phase of the at least one filter clock with respect to the chop clock to reduce chopper noise on the reference voltage.

2. The apparatus of claim 1, wherein the filter timing adjuster generates a first filter clock (PH1) and a second filter clock (PH2), and wherein the filter timing adjuster adjusts a phase of the PH1 clock and a phase of the PH2 clock with respect to the chop clock to reduce chopper noise on the filtered signal.

3. The apparatus of claim 2, wherein the filter timing adjuster comprises:
   an offset sign detector that the receives the chop clock, and the amplified signal, and generates a polarity indicator; and an exclusive-OR (XOR) gate that receives the chop clock and the polarity indicator and outputs a polarity phased servo clock adjusted in phase by 0 or 180 degrees to reduce chopper noise for offsets of that polarity.

4. The apparatus of claim 3, wherein the filter timing adjuster comprises:
a chopper noise null servo that receives the polarity phased servo clock and the reference voltage and generates a delay control signal;
a voltage controlled delay that receives the chop clock and the delay control signal and generates a delayed chop clock; and
a non-overlap clock generator that receives the delayed chop clock and generates the PH1 filter clock and the PH2 filter clock.

5. The apparatus of claim 1, wherein the chopper amplifier comprises a first GM stage.

6. The apparatus of claim 5, further comprising:
a second GM stage that receives a filter output signal from the switched capacitor filter and generates a second amplified signal;
a third GM stage that receives the second amplified signal and a fourth amplified signal and generates a third amplified signal; and
a buffer stage that receives a filtered version of the third amplified signal and generates the reference voltage.

7. The apparatus of claim 6, further comprising:
a fourth GM stage receives the input voltage and generates the fourth amplified signal.

8. The apparatus of claim 7, further comprising:
a modified nested miller compensation circuit having a compensation input that receives the third amplified signal reference voltage and having a first compensation output that outputs a first feedback signal that is input to the switched capacitor filter, a second compensation output that outputs a second feedback signal that is input to the second GM stage, and a third compensation output that outputs a third feedback signal that is input to the third GM stage.

9. The apparatus of claim 8, wherein the modified nested miller compensation circuit comprises:
a first capacitor connected between the compensation input and the first compensation output;
a second capacitor connected between the compensation input and the second compensation output;
a third capacitor connected between the compensation input and the third compensation output;
a fourth capacitor connected between a non-inverting input of the third GM stage and a signal ground; and
a fifth capacitor connected between an output of the first GM stage and the signal ground.

10. The apparatus of claim 1, wherein the apparatus forms a bandgap reference voltage generator.

11. An apparatus comprising:
a chopper amplifier having an input that receives an input signal and an output that outputs an amplified signal, the chopper amplifier includes an input chopping circuit coupled to the input and an output chopping circuit coupled to the output, the input and output chopping circuits operate in response to a chop clock;
means for filtering the amplified signal to generate a filtered signal, the means for filtering operates in response to at least one filter clock; and
means for adjusting a phase of the filter clock relative to the chop clock to adjust the means for filtering to reduce chopper noise on the filtered signal.

12. The apparatus of claim 11, wherein the means for adjusting generates a first filter clock (PH1) and a second filter clock (PH2), and wherein the means for adjusting adjusts a phase of the PH1 clock and a phase of the PH2 clock with respect to the chop clock to reduce chopper noise on the filtered signal.

13. The apparatus of claim 12, wherein the means for adjusting comprises:
means for generating a polarity indicator from the chop clock and an amplified input signal; and
means for exclusive-ORing (XOR) the chop clock and the polarity indicator to generate a polarity phased servo clock that is adjusted in phase by either 0 or 180 degrees to reduce chopper noise for offsets of that polarity.

14. The apparatus of claim 13, wherein the means for adjusting comprises:
means for generating a delay control signal from the polarity phased servo clock and a reference voltage;
means for generating a delayed chop clock from the chop clock and the delay control signal; and
means for generating non-overlapping versions of the PH1 and PH2 filter clocks from the delayed chop clock.

15. A method comprising:
amplifying an input signal using a chopper amplifier to generate an amplified signal, wherein the chopper amplifier includes an input chopping circuit coupled to receive the input signal and an output chopping circuit coupled to the output the amplified signal, the input and output chopping circuits operate in response to a chop clock;
filtering the amplified signal to generate a filtered signal, wherein the filtering is performed using at least one filter clock; and
adjusting a phase of the at least one filter clock relative to the chop clock to reduce chopper noise on a reference voltage.

16. The method of claim 15, wherein the operation of adjusting comprises generating a first filter clock (PH1) and a second filter clock (PH2), and adjusting a phase of the PH1 clock and a phase of the PH2 clock with respect to the chop clock to reduce chopper noise on the reference voltage.

17. The method of claim 16, wherein the operation of adjusting comprises:
generating a polarity indicator from the chop clock and an amplified input signal; and
exclusive-ORing (XOR) the chop clock and the polarity indicator to generate a polarity phased servo clock that is adjusted in phase by either 0 or 180 degrees to reduce chopper noise for offsets of that polarity.

18. The method of claim 17, wherein the operation of adjusting comprises generating a delay control signal from the polarity phased servo clock and the reference voltage.

19. The method of claim 18, wherein the operation of adjusting comprises generating a delayed chop clock from the chop clock and the delay control signal.

20. The method of claim 19, wherein the operation of adjusting comprises generating non-overlapping versions of the PH1 and PH2 filter clocks from the delayed chop clock.

* * * * *